(12) United States Patent
Weng

(10) Patent No.: US 12,355,414 B2
(45) Date of Patent: *Jul. 8, 2025

(54) SURFACE ACOUSTIC WAVE FILTER WAFER-LEVEL PACKAGING STRUCTURE AND METHOD

(71) Applicant: Shenzhen Newsonic Technologies Co., Ltd., Shenzhen (CN)

(72) Inventor: Guojun Weng, Shenzhen (CN)

(73) Assignee: Shenzhen Newsonic Technologies Co., Ltd., Shenzhen (CN)

( * ) Notice: Subject to any disclaimer, the term of this patent is extended or adjusted under 35 U.S.C. 154(b) by 120 days.

This patent is subject to a terminal disclaimer.

(21) Appl. No.: 18/056,799

(22) Filed: Nov. 18, 2022

(65) Prior Publication Data

US 2023/0081950 A1   Mar. 16, 2023

(51) Int. Cl.
  *H03H 3/08* (2006.01)
(52) U.S. Cl.
  CPC ..................... *H03H 3/08* (2013.01)
(58) Field of Classification Search
  CPC ......... H03H 3/08; H03H 9/059; H03H 9/1092
  See application file for complete search history.

(56) References Cited

U.S. PATENT DOCUMENTS

| | | | | |
|---|---|---|---|---|
| 2010/0277037 A1* | 11/2010 | Fukano | ................ | H03H 9/1092 29/25.35 |
| 2018/0076786 A1* | 3/2018 | Funahashi | .......... | H03H 9/02535 |
| 2018/0241370 A1* | 8/2018 | Sekiya | .................... | H01L 24/13 |
| 2019/0288665 A1* | 9/2019 | Hatsuda | .................. | H03F 3/245 |
| 2020/0007108 A1 | 1/2020 | Huebner | | |
| 2020/0294947 A1* | 9/2020 | Otsuka | .................... | H01L 24/13 |
| 2021/0028766 A1* | 1/2021 | Hurwitz | .................. | H01L 24/13 |

FOREIGN PATENT DOCUMENTS

CN   110100387 A   8/2019

OTHER PUBLICATIONS

Wikipedia, Sputter Deposition, Screen shot taken on Mar. 14, 2021, available at https://en.wikipedia.org/wiki/Sputter_deposition (Year: 2021).*
International Search Report and Written Opinion issued by the International Searching Authority for International Application No. PCT/IB2023/061575 dated Feb. 8, 2024 (13 pages).

* cited by examiner

*Primary Examiner* — Kyle A Cook
(74) *Attorney, Agent, or Firm* — Finnegan, Henderson, Farabow, Garrett & Dunner LLP.

(57) ABSTRACT

A fabrication method of a surface acoustic wave (SAW) filter includes obtaining a filter wafer, which includes: obtaining a first substrate; and forming an interdigital transducer (IDT) on the first substrate, the IDT including a first input and output end, a second input and output end, and an interdigital portion. The method further includes: forming a dielectric layer on the filter wafer, the dielectric layer covering the first input and output end and the second input and output end of the IDT, and exposing the interdigital portion; forming a passivation layer on the dielectric layer; forming a bonding layer on the passivation layer; and bonding a second substrate to the filter wafer via the bonding layer, wherein a cavity is enclosed by the second substrate and the bonding layer.

8 Claims, 32 Drawing Sheets

SURFACE ACOUSTIC WAVE FILTER WAFER-LEVEL PACKAGING STRUCTURE AND METHOD

FIELD OF THE DISCLOSURE

The present disclosure relates to the field of semiconductor devices and, in particular, to a surface acoustic wave (SAW) filter wafer-level packaging structure and a SAW wafer-level packing method.

BACKGROUND

Surface acoustic wave (SAW) devices, such as SAW resonators and SAW filters, are used in many applications such as radio frequency (RF) filters. A typical SAW filter includes a plurality of interdigital transducers (IDTs) formed on a piezoelectric substrate. The plurality of IDTs are connected in series or in parallel.

As the use of SAW filters in modern RF communication systems increases, there is a need for SAW filters with small sizes and low costs.

SUMMARY

According to one aspect of the disclosure, a surface acoustic wave (SAW) filter is provided. The SAW filter includes a filter wafer including: a first substrate; and an interdigital transducer (IDT) disposed on the first substrate, the IDT including a first input and output end, a second input and output end, and an interdigital portion. The SAW filter also includes a dielectric layer disposed on the filter wafer, covering the first input and output end and the second input and output end of the IDT and exposing the interdigital portion; a passivation layer disposed on the dielectric layer; a bonding layer disposed on the passivation layer; a second substrate bonded to the filter wafer via the bonding layer; and a cavity enclosed by the second substrate and the bonding layer.

According to another aspect of the disclosure, a SAW filter is provided. The SAW filter includes a filter wafer including: a first substrate; an interdigital transducer (IDT) disposed on the first substrate, the IDT including a first input and output end, a second input and output end, and an interdigital portion; a temperature compensation layer disposed on the first substrate, covering the IDT; and a passivation layer disposed on the temperature compensation layer. The SAW filter also includes a dielectric layer disposed on the filter wafer, and exposing a portion of the passivation layer disposed above the interdigital portion of the IDT; a bonding layer disposed on the dielectric layer; a second substrate bonded to the filter wafer via the bonding layer; and a cavity enclosed by the second substrate and the bonding layer.

According to one aspect of the disclosure, a fabrication method of a surface acoustic wave (SAW) filter is provided. The method includes obtaining a filter wafer, including: obtaining a first substrate; and forming an interdigital transducer (IDT) on the first substrate, the IDT including a first input and output end, a second input and output end, and an interdigital portion. The method also includes: forming a dielectric layer on the filter wafer, the dielectric layer covering the first input and output end and the second input and output end of the IDT, and exposing the interdigital portion; forming a passivation layer on the dielectric layer; forming a bonding layer on the passivation layer; and bonding a second substrate to the filter wafer via the bonding layer. A cavity is enclosed by the second substrate and the bonding layer.

According to another aspect of the disclosure, a fabrication method of a surface acoustic wave (SAW) filter is provided. The method includes forming a filter wafer, including: obtaining a first substrate; forming an interdigital transducer (IDT) on the first substrate, the IDT including a first input and output end, a second input and output end, and an interdigital portion; forming a temperature compensation layer on the first substrate, covering the IDT; and forming a passivation layer on the temperature compensation layer. The method also includes forming a dielectric layer on the filter wafer, the dielectric layer exposing a portion of the passivation layer disposed above the interdigital portion of the IDT; forming a bonding layer on the dielectric layer; and bonding a second substrate to the filter wafer via the bonding layer. A cavity is enclosed by the second substrate and the bonding layer.

BRIEF DESCRIPTION OF THE DRAWINGS

The accompanying drawings, which are incorporated in and constitute a part of this application, illustrate disclosed embodiments and, together with the description, serve to explain the disclosed embodiments.

DETAILED DESCRIPTION

Figure 1A:
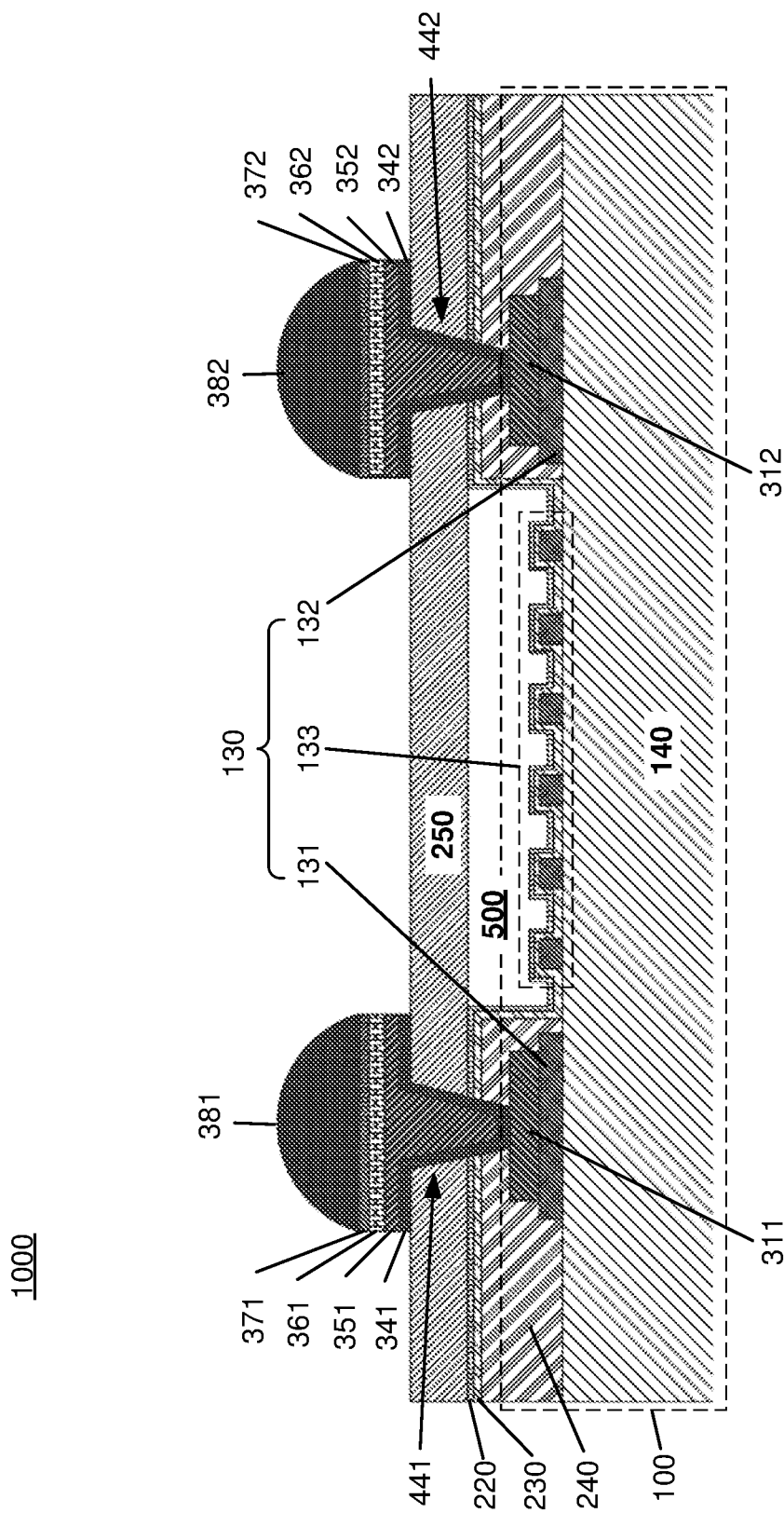
FIG. 1A is a cross-sectional view of a SAW filter, according to an embodiment of the present disclosure.

The text below provides a detailed description of the present disclosure in conjunction with specific embodiments illustrated in the attached drawings. However, these embodiments do not limit the present disclosure. The scope of protection for the present disclosure covers changes made to the structure, method, or function by persons having ordinary skill in the art on the basis of these embodiments.

To facilitate the presentation of the drawings in the present disclosure, the sizes of certain structures or portions may be enlarged relative to other structures or portions. Therefore, the drawings in the present disclosure are only for the purpose of illustrating the basic structure of the subject matter of the present disclosure. The same numbers in different drawings represent the same or similar elements unless otherwise represented.

Additionally, terms in the text indicating relative spatial position, such as "top," "bottom," "upper," "lower," "above," "below," and so forth, are used for explanatory purposes in describing the relationship between a unit or feature depicted in a drawing and another unit or feature therein. Terms indicating relative spatial position may refer to positions other than those depicted in the drawings when a device is being used or operated. For example, if a device shown in a drawing is flipped over, a unit which is described as being positioned "below" or "under" another unit or feature will be located "above" the other unit or feature. Therefore, the illustrative term "below" may include positions both above and below. A device may be oriented in other ways (e.g., rotated 90 degrees or facing another direction), and descriptive terms that appear in the text and are related to space should be interpreted accordingly. When a component or layer is said to be "above" another member or layer or "connected to" another member or layer, it may be directly above the other member or layer or directly connected to the other member or layer, or there may be an intermediate component or layer.

A traditional SAW filter wafer-level packaging structure uses a double-layer organic dry film to form a filter cavity. Specifically, a first organic layer of the double-layer organic dry film is patterned to form the cavity wall and a second organic layer is attached on top of the first organic layer to form the cavity roof. The double-layer organic dry film solution for filter cavity forming has the following disadvantages. First, the cavity size is controlled to a relatively small size, otherwise a subsequent substrate-level packaging process might cause the organic dry film covering the filter cavity to collapse. In order to control the cavity size to be relatively small, an organic wall is placed between resonators of the SAW filter, especially when the surface area of the resonators needs to be large according to certain design requirement. As a result of placing the organic wall between the resonators, the SAW filter may have a larger resonator to resonator space, and consequently lager SAW filter chip size, and higher production cost. In addition, the price of the double-layer organic dry film is relatively high price, resulting in higher chip cost.

The above problems can be overcome by bonding a silicon wafer to cover the filter cavity. Traditional silicon wafer bonding processes (e.g., silicon wafer-$SiO_2$ bonding, silicon cap-organic film bonding, silicon cap/metal layer-metal layer bonding) require a heating process to achieve a high temperature of above 200° C. Since the thermal expansion coefficients of the silicon wafer and the SAW filter substrate (usually made of lithium tantalate or lithium niobate) are very different, the lithium tantalate and lithium niobate substrates will crack during the heating process, which leads to technical difficulties to achieve wafer-level packaging of SAW filters by silicon wafer bonding.

Embodiments of the present disclosure provide a surface acoustic wave filter wafer-level packaging structure and a fabrication method thereof, in which a dielectric layer is used to form the sidewalls of the cavity, and a low-temperature Si—Si bonding is performed to realize the wafer-level package. No heating may be required during the fabrication process. As a result, cracking of the lithium tantalate and lithium niobate substrates may be avoided.

Figure 1B:
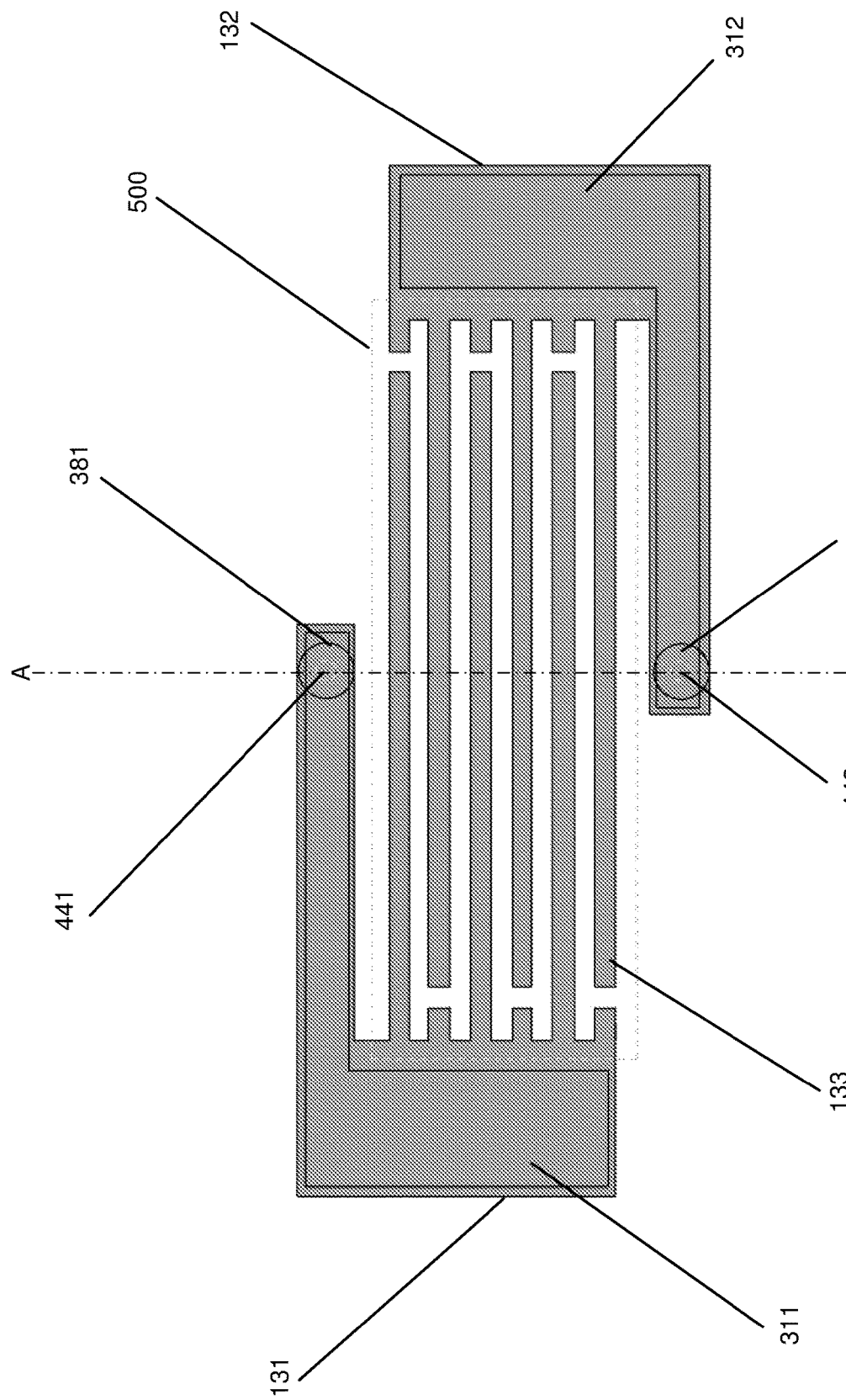
FIG. 1B is a top view showing selected portions of the SAW filter of FIG. 1A, according to an embodiment of the present disclosure.

FIG. 1A is a cross-sectional view of a SAW filter 1000, according to an embodiment of the present disclosure. FIG. 1B is a top view showing selected portions of SAW filter 1000, according to an embodiment of the present disclosure. FIG. 1A shows the cross section along line A-A' in FIG. 1B. SAW filter 1000 in FIGS. 1A and 1B may to referred to as a "normal SAW".

As illustrated in FIGS. 1A and 1B, SAW filter 1000 includes a filter wafer 100 which includes a first substrate 140, an interdigital transducer (IDT) 130 disposed on first substrate 140 and including a first input and output end 131, a second input and output end 132, and an interdigital portion 133, a first pad metal layer 311 disposed above first input and output end 131 of IDT 130, and a second pad metal layer 312 disposed above second input and output end 132 of IDT 130. SAW filter 1000 also includes a dielectric layer 240 disposed on filter wafer 100, a passivation layer 230 disposed on dielectric layer 240, a bonding layer 220 disposed on passivation layer 230, a second substrate 250 bonded to filter wafer 100 via bonding layer 220, and a cavity 500 enclosed by second substrate 250 and bonding layer 220. Dielectric layer 240 covers first input and output end 131 and second input and output end 132 of IDT 130, and exposes interdigital portion 133.

Figure 1C:
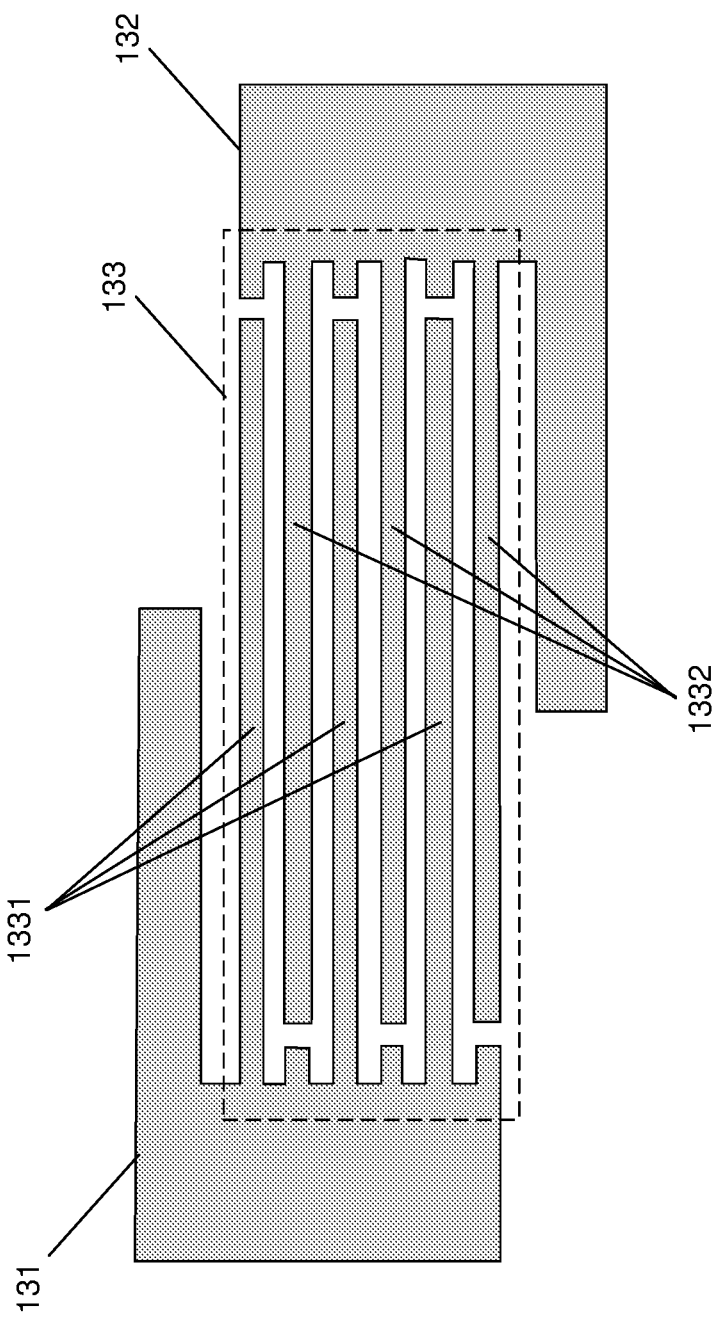
FIG. 1C is a top view of an interdigital transducer (IDT), according to an embodiment of the present disclosure.

FIG. 1C is a top view of IDT 130, according to an embodiment of the present disclosure. As illustrated in FIG. 1C, interdigital portion 133 is disposed between first input and output end 131 and second input and output end 132. Interdigital portion 133 includes a first set of electrode fingers 1331 coupled to first input and output end 131, and a second set of electrode fingers 1332 coupled to second input and output end 132. The second set of electrode fingers 1332 are interleaved with and parallel to the first set of electrode fingers 1331.

In some embodiments, dielectric layer 240 covers all of filter wafer 100 except for interdigital portion 133 of IDT 130. In some other embodiments, dielectric layer 240 covers part of filter wafer 100 except for interdigital portion 133 of IDT 130. Dielectric layer 240 may be formed of silicon oxide, silicon nitride, or a stacked combination of those materials.

Passivation layer 230 covers a top surface and surface layerside surfaces of dielectric layer 240, and top surfaces and side surfaces of electrode fingers 1331 and 1332 in interdigital portion 133 of IDT 130. Passivation layer 230 may be formed of silicon oxide, silicon nitride, aluminum nitride, or a stacked combination of two or more of those materials. Passivation layer 230 has a thickness ranging from approximately 2 nm to approximately 50 nm.

Bonding layer 220 is disposed on a top surface and side surfaces of passivation layer 230. Bonding layer 220 may be a thin silicon layer formed of silicon, and may have a thickness ranging from approximately 3 nm to approximately 50 nm.

First substrate 140 may be formed of a piezoelectric material, such as lithium tantalate or lithium niobate.

At least a surface layer of second substrate 250 facing filter wafer 100 may be formed of silicon. In some embodiments, the entire second substrate 250 may be a silicon wafer.

A first through silicon via (TSV) 441 and a second TSV 442 are formed in second substrate 250, bonding layer 220, passivation layer 230, and dielectric layer 240. First TSV 441 exposes first pad metal layer 311, and second TSV 442 exposes second pad metal layer 312.

A first seed layer 341 covers side surfaces and a bottom of first TSV 441 and a first portion of a top surface of second substrate 250 around first TSV 441. A second seed layer 342 covers side surfaces and a bottom of second TSV 442 and a second portion of the top surface of second substrate 250 around second TSV 442. First seed layer 341 and second seed layer 342 may be formed of a stack of Ti and Cu, or a stack of Cr and Cu.

A first metal filling layer 351 is disposed on first seed layer 341 and filled in first TSV 441. A second metal filling layer 352 is disposed on second seed layer 342 and filled in second TSV 442. First metal filling layer 351 and second metal filling layer 352 may be formed of Cu.

A first Ni layer 361 is disposed on first metal filling layer 351. A second Ni layer 362 is disposed on second metal filling layer 352. First Ni layer 361 and second Ni layer 362 may have a thickness of approximately 3 µm.

A first Au layer 371 is disposed on first Ni layer 361. A second Au layer 372 is disposed on second Ni layer 362. First Au layer 371 and second Au layer 372 may have a thickness ranging from approximately 0.05 µm to approximately 0.30 µm.

A first solder bump 381 is disposed above first TSV 441 and electrically connected to first input and output end 131 of IDT 130 via first pad metal layer 311, first metal filling layer 351, first Ni layer 361, and first Au layer 371. A second solder bump 382 is disposed above second TSV 442 and electrically connected to second input and output end 132 of IDT 130 via second pad metal layer 312, second metal filling layer 352, second Ni layer 362, and second Au layer 372.

Figure 2:
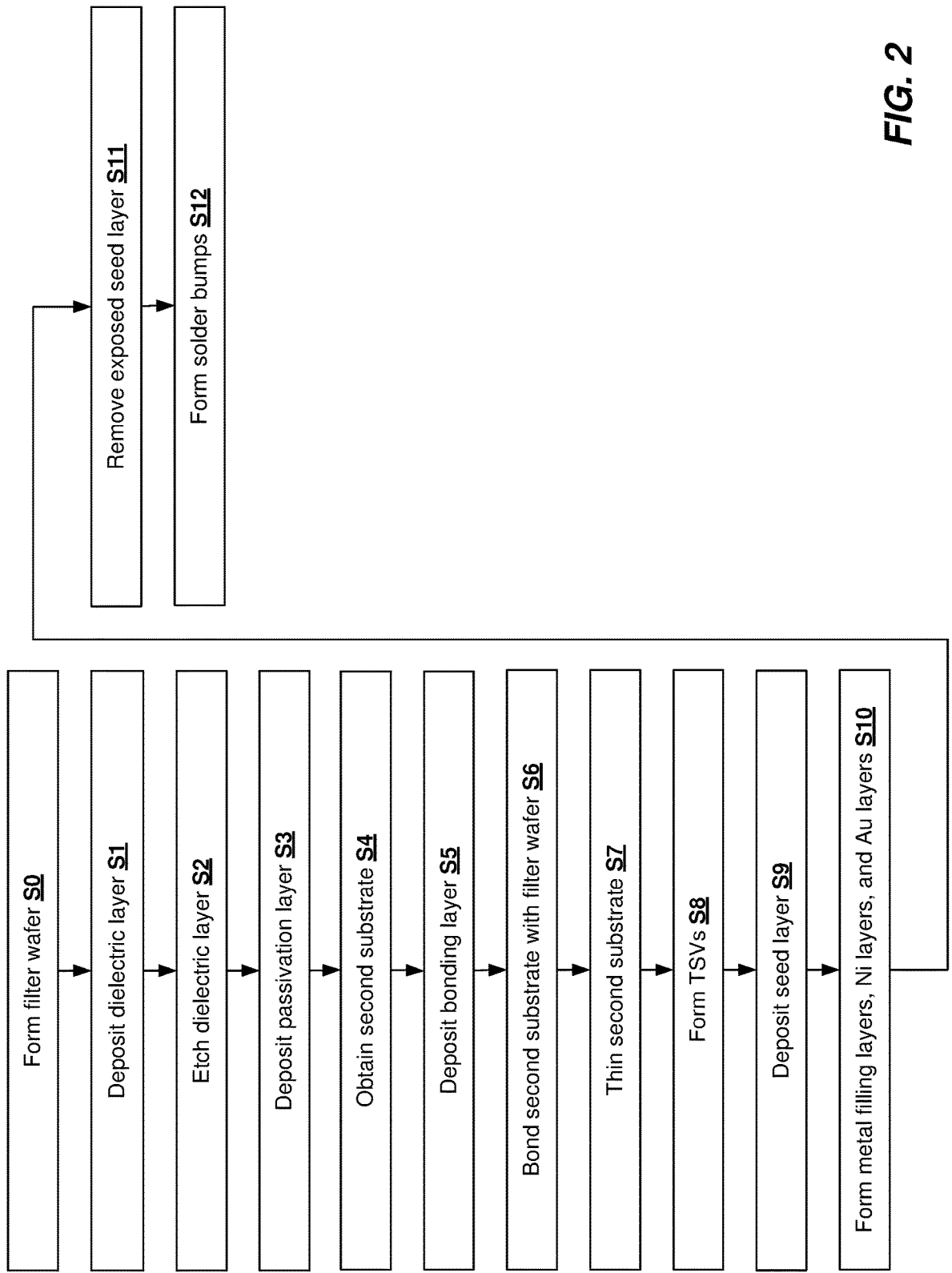
FIG. 2 is a flow chart of a process of fabricating the SAW filter of FIG. 1A, according to an embodiment of the present disclosure.

FIG. 2 is a flow chart of a process of fabricating SAW filter 1000, according to an embodiment of the present disclosure. FIGS. 3A-3M are cross-sectional views of structures formed in the process of FIG. 2, according to an embodiment of the present disclosure.

Figure 3A:
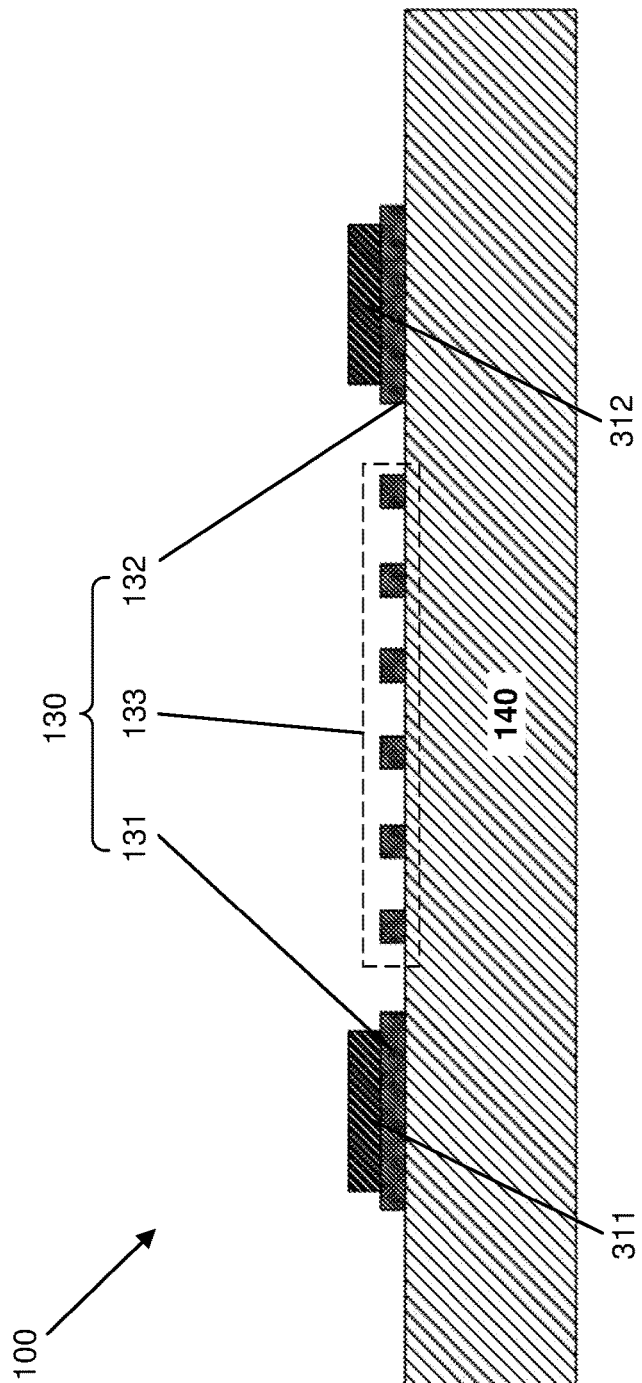
FIGS. 3A-3M are cross-sectional views of structures formed in the process of FIG. 2, according to an embodiment of the present disclosure.

As illustrated in FIG. 3A, in step S0, filter wafer 100 is formed. Specifically, first substrate 140 is obtained. First substrate 140 may be formed of a piezoelectric material, such as lithium tantalate or lithium niobate. IDT 130 is then formed on first substrate 140. IDT 130 includes first input and output end 131, second input and output end 132, and interdigital portion 133. Next, first pad metal layer 311 is formed above first input and output end 131 of IDT 130, and second pad metal layer 312 is formed above second input and output end 132 of IDT 130. Thus, filter wafer 100 is formed.

Figure 3B:
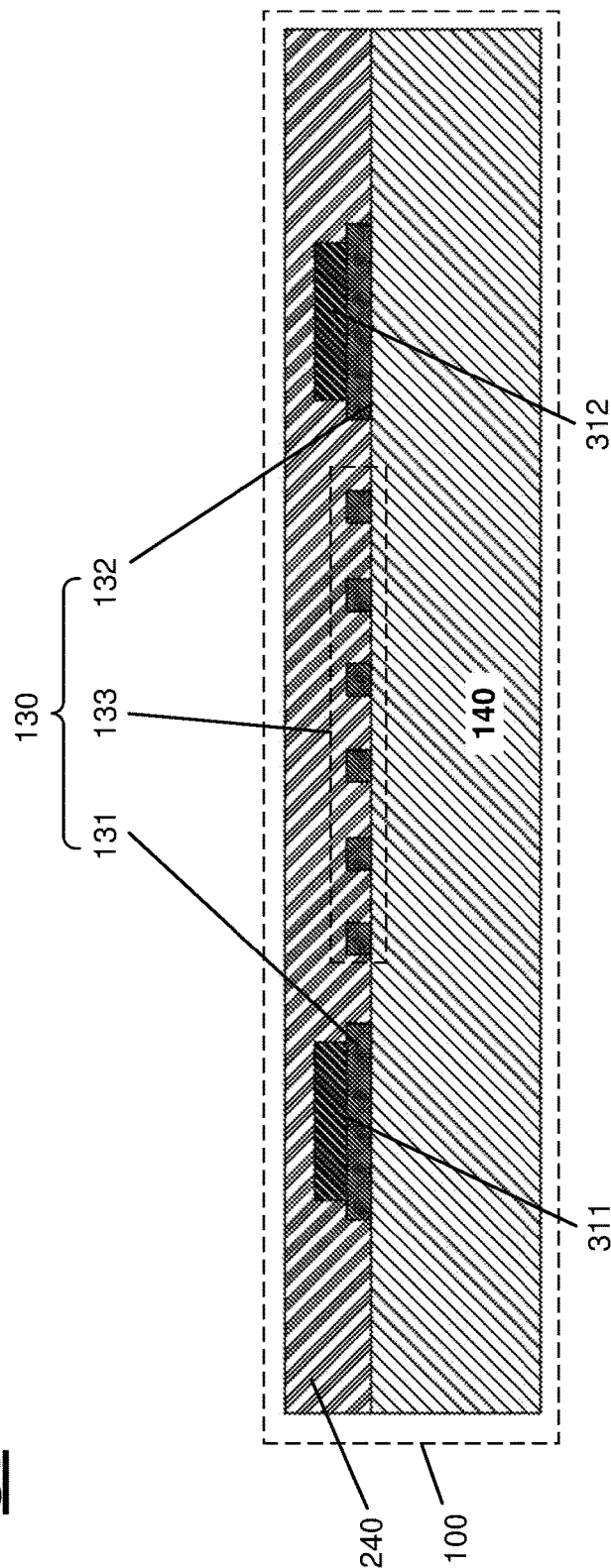

As illustrated in FIG. 3B, in step S1, dielectric layer 240 is deposited on filter wafer 100, and is planarized by chemical mechanical polishing (CMP). Dielectric layer 240 completely covers first input and output end 131, second input and output end 132, and interdigital portion 133 of IDT 130, first pad metal layer 311, and second pad metal layer 312. Dielectric layer 240 may be formed of silicon oxide, silicon nitride, or other dielectric materials, or a stacked combination of two or more of those materials.

Figure 3C:
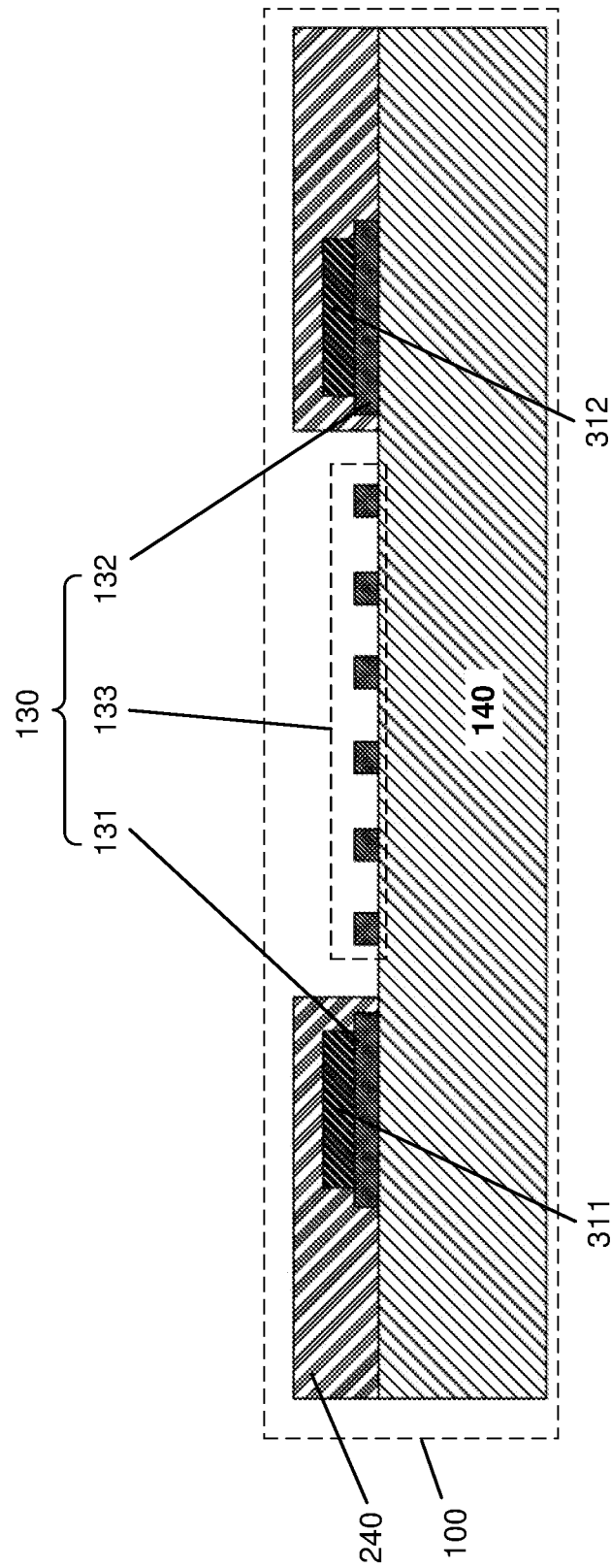

As illustrated in FIG. 3C, in step S2, dielectric layer 240 is etched to expose interdigital portion 133 of IDT 130.

Figure 3D:
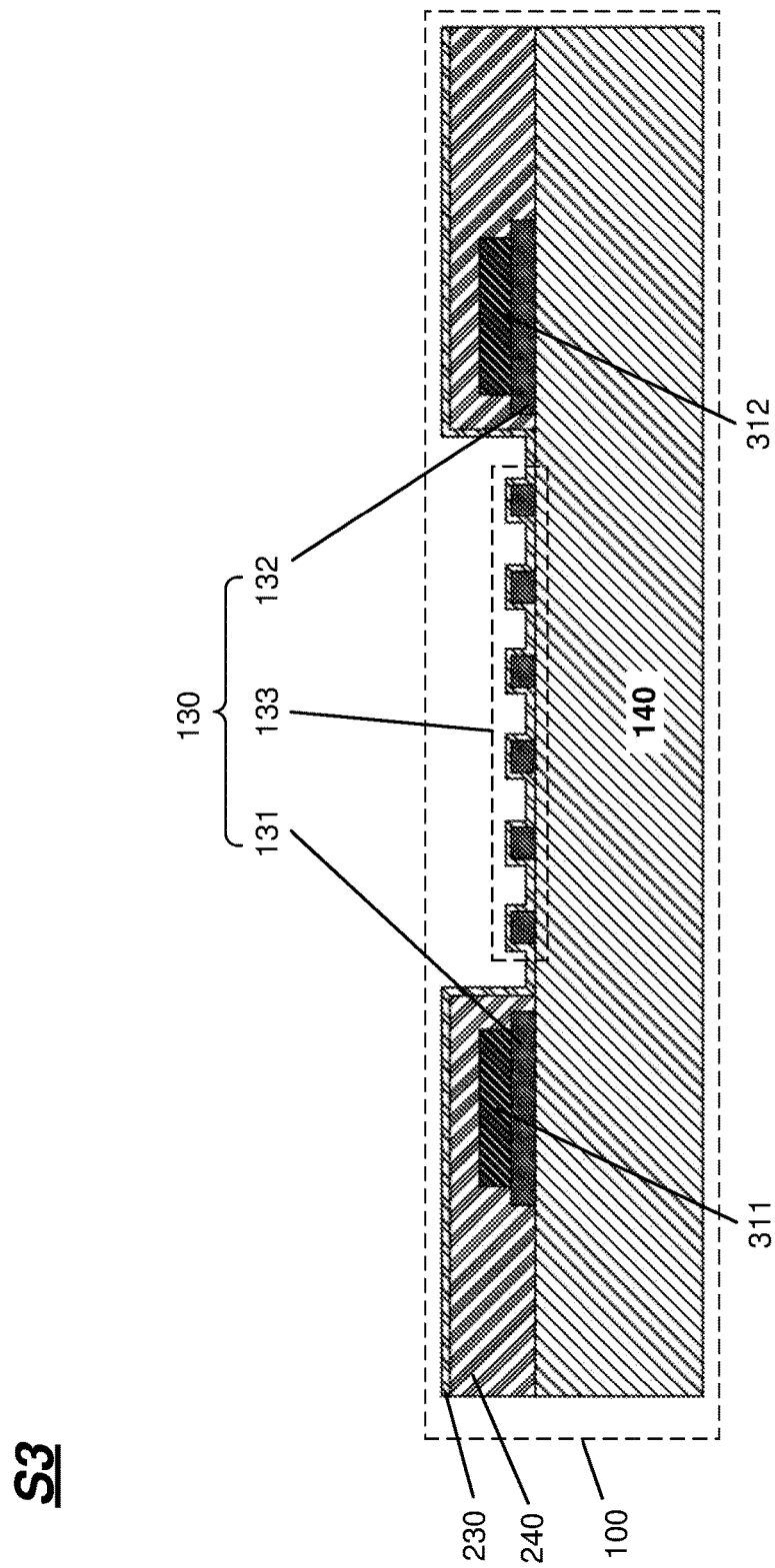

As illustrated in FIG. 3D, in step S3, passivation layer 230 is deposited on dielectric layer 240. As a result, passivation layer 230 covers the top surface and side surfaces of dielectric layer 240, and the top surfaces and side surfaces of electrode fingers 1331 and 1332 in interdigital portion 133 of IDT 130. Passivation layer 230 has a thickness ranging from approximately 2 nm to approximately 50 nm. Passivation layer 230 is formed of non-conductive materials such as silicon oxide, silicon nitride, aluminum nitride, amorphous silicon, or a combination of two or more of those materials.

Figure 3E:
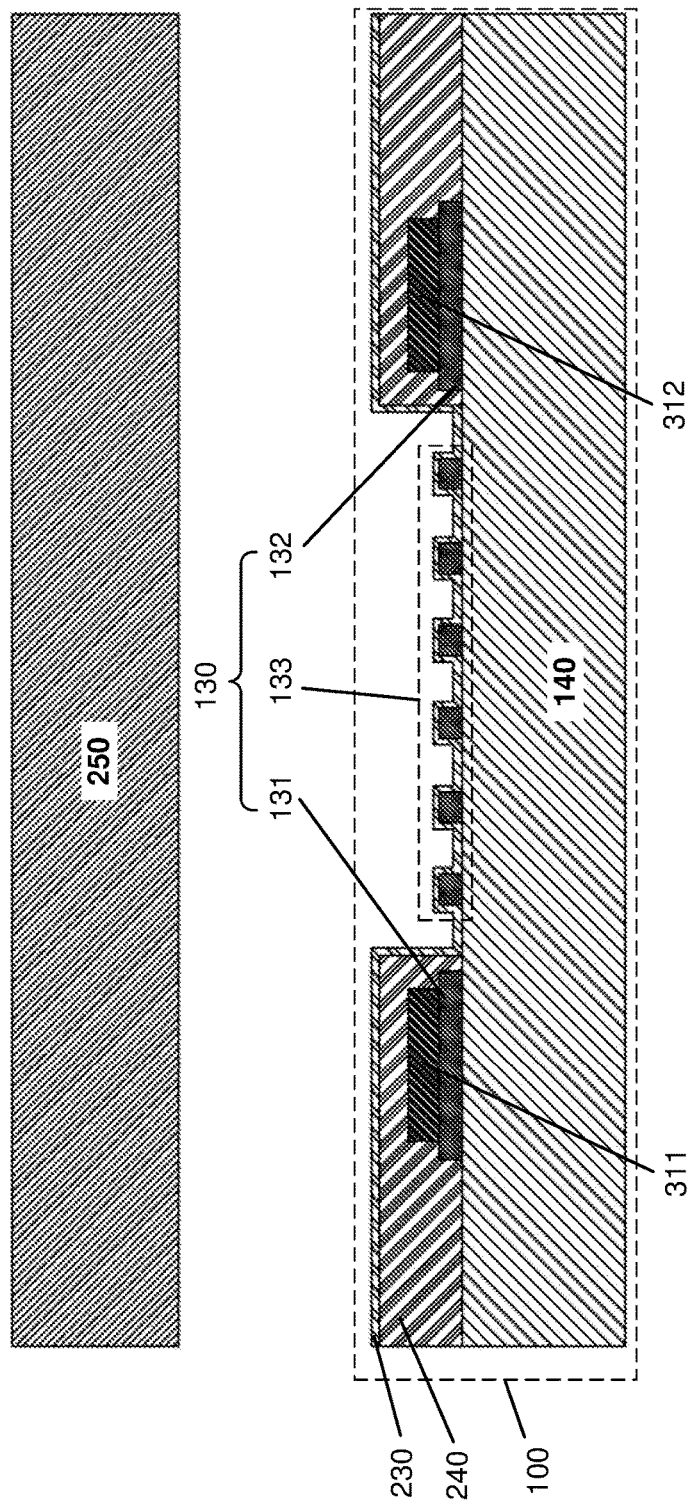

As illustrated in FIG. 3E, in step S4, second substrate 250 is obtained. In some embodiments, second substrate 250 may be high-resistance silicon wafer. In some other embodiments, at least a surface layer of second substrate 250 facing filter wafer 100 is formed of a high-resistance silicon material.

Figure 3F:
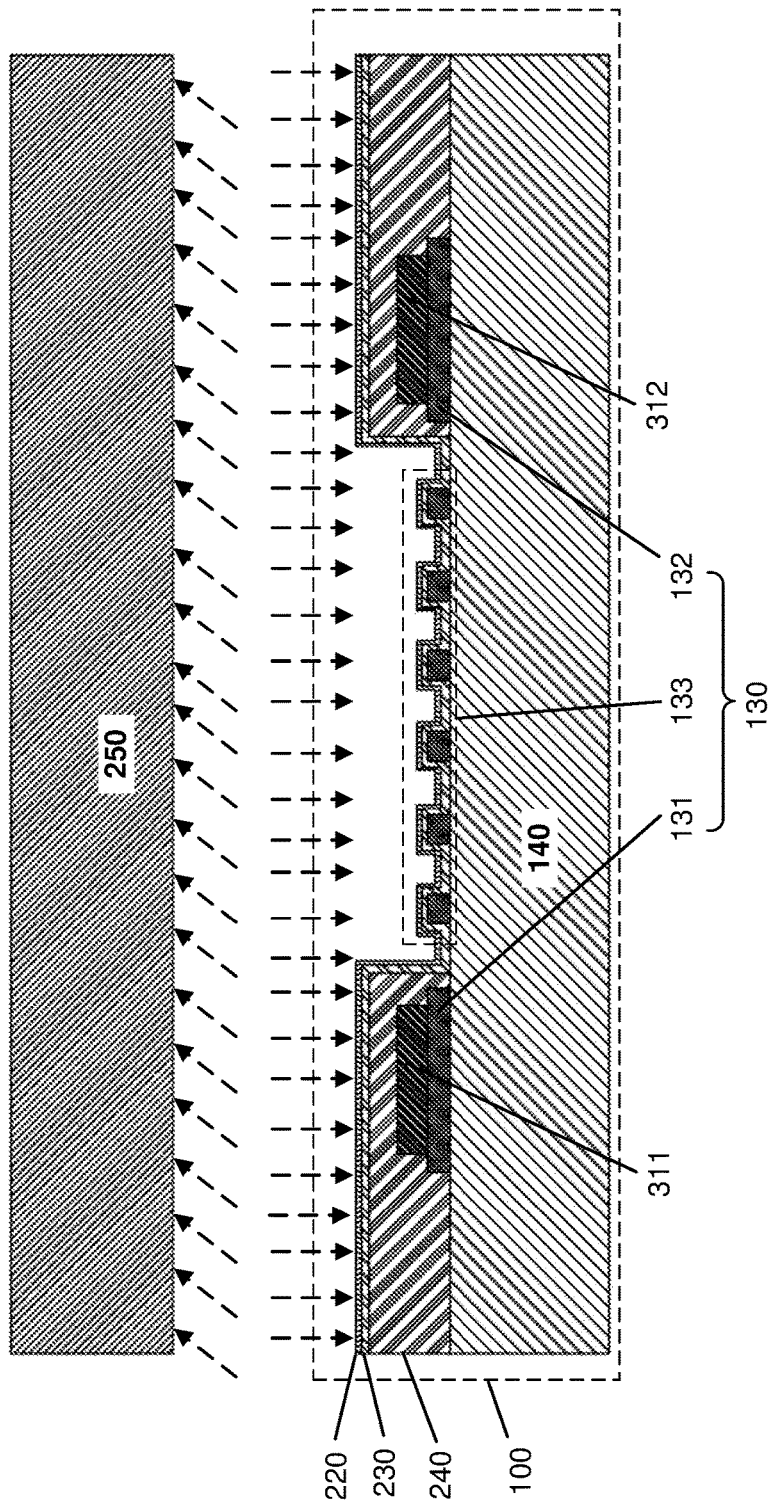

As illustrated in FIG. 3F, in step S5, a sputter target is sputtered in a vacuum environment to deposit bonding layer 220 on passivation layer 230. The sputtering process may include physical vapor deposition (PVD) or electron beam irradiation. In some embodiments, second substrate 250 may be used as the sputtering target. In some other embodiments, another silicon wafer may be used as the sputtering target. Bonding layer 220 may be deposited on a top surface and side surfaces of passivation layer 230. Bonding layer 220 may be formed of amorphous silicon (amorphous-Si), and may have a thickness ranging from approximately 3 nm to approximately 50 nm.

Figure 3G:
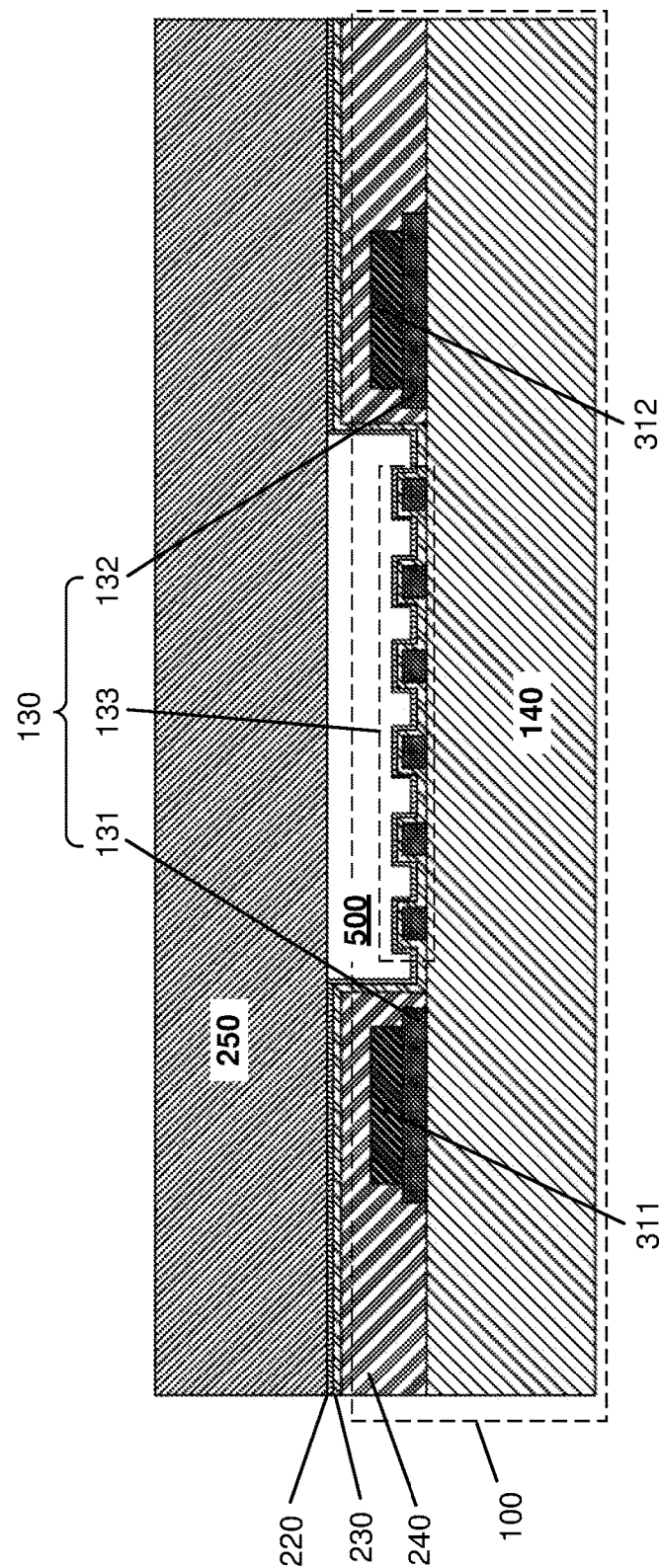

As illustrated in FIG. 3G, in step S6, after depositing bonding layer 220 and without exposing bonding layer 220 to air, second substrate 250 is bonded to filter wafer 100 via bonding layer 220 in the vacuum environment. In the present embodiment, the bonding process is a low-temperature process without thermal annealing. The low-temperature bonding process of the present embodiments can avoid cracking of first substrate 140 during a thermal annealing process due to a large difference between the thermal expansion coefficients of first substrate 140 (formed of lithium tantalate or lithium niobate) and second substrate 250 (formed of silicon). As a result of the bonding process, cavity 500 is formed.

Figure 3H:
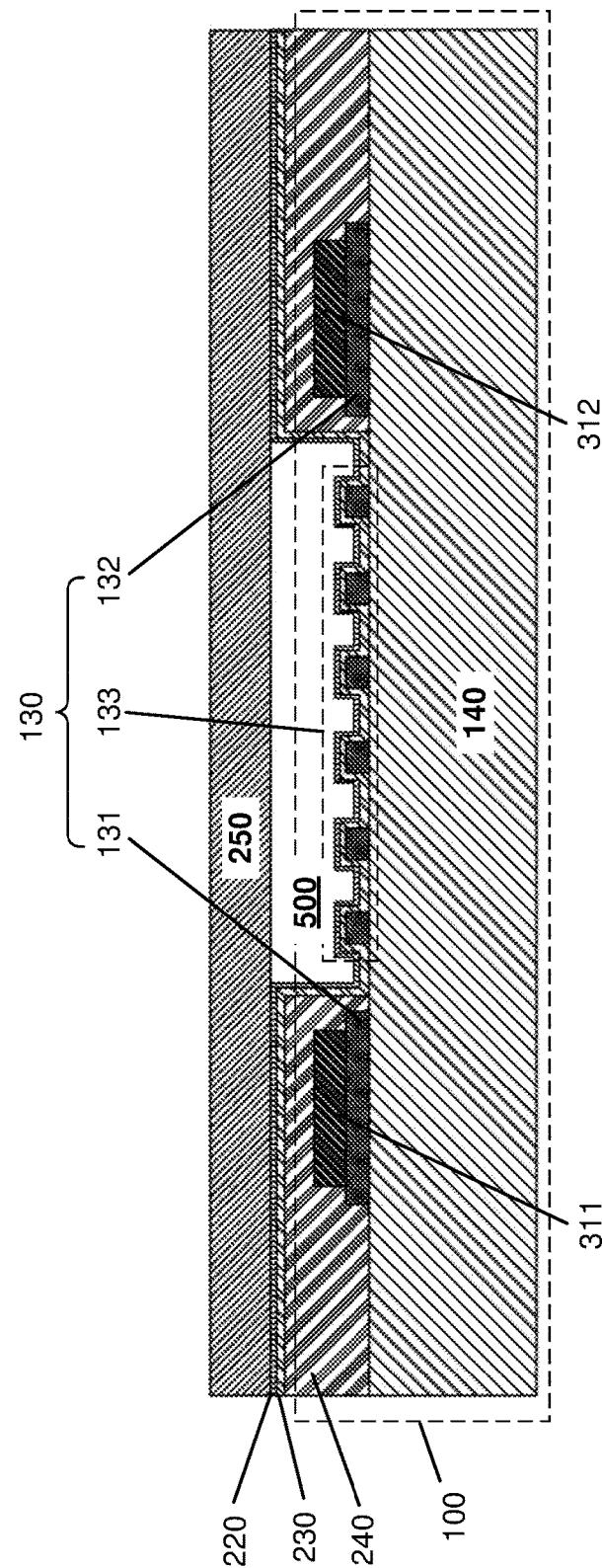

As illustrated in FIG. 3H, in step S7, second substrate 250 is thinned to a desired thickness. In some embodiments, step S7 may be skipped.

Figure 3I:
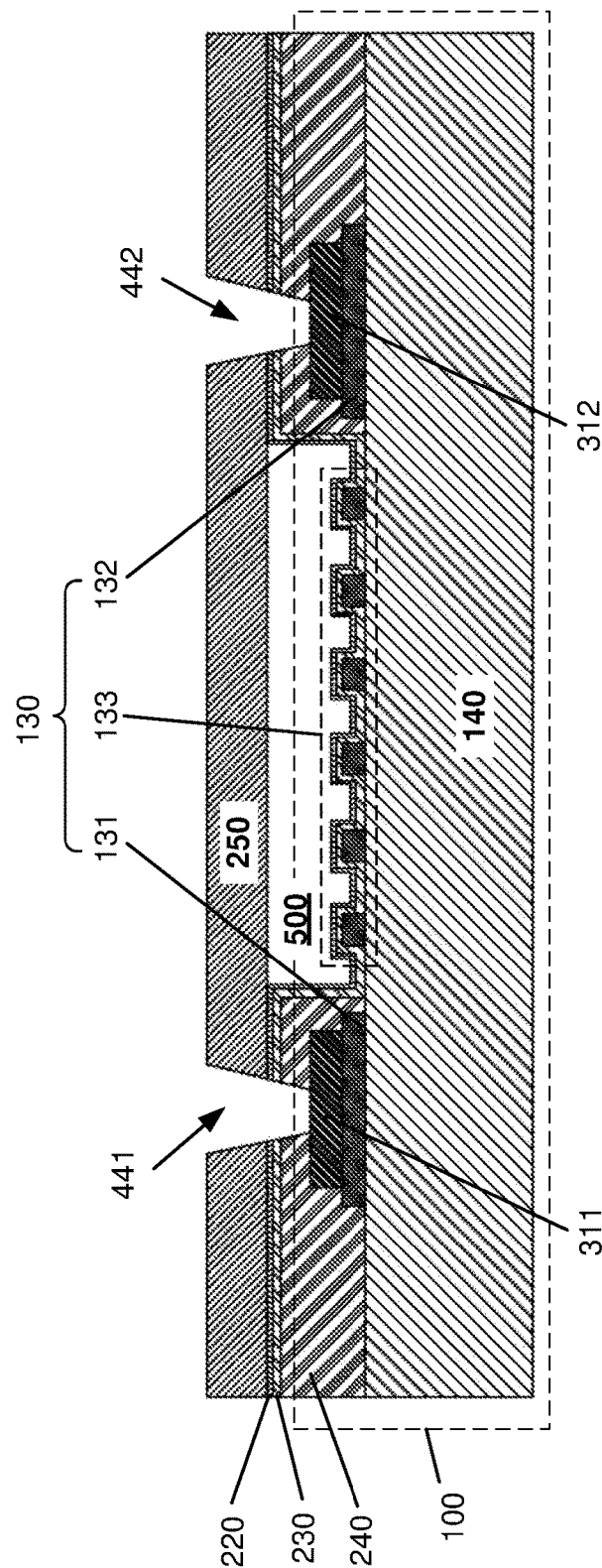

As illustrated in FIG. 3I, in step S8, first TSV 441 and second TSV 442 are formed by etching second substrate 250, bonding layer 220, passivation layer 230, and dielectric layer 240. First TSV 441 exposes first pad metal layer 311, and second TSV 442 exposes second pad metal layer 312.

Figure 3J:
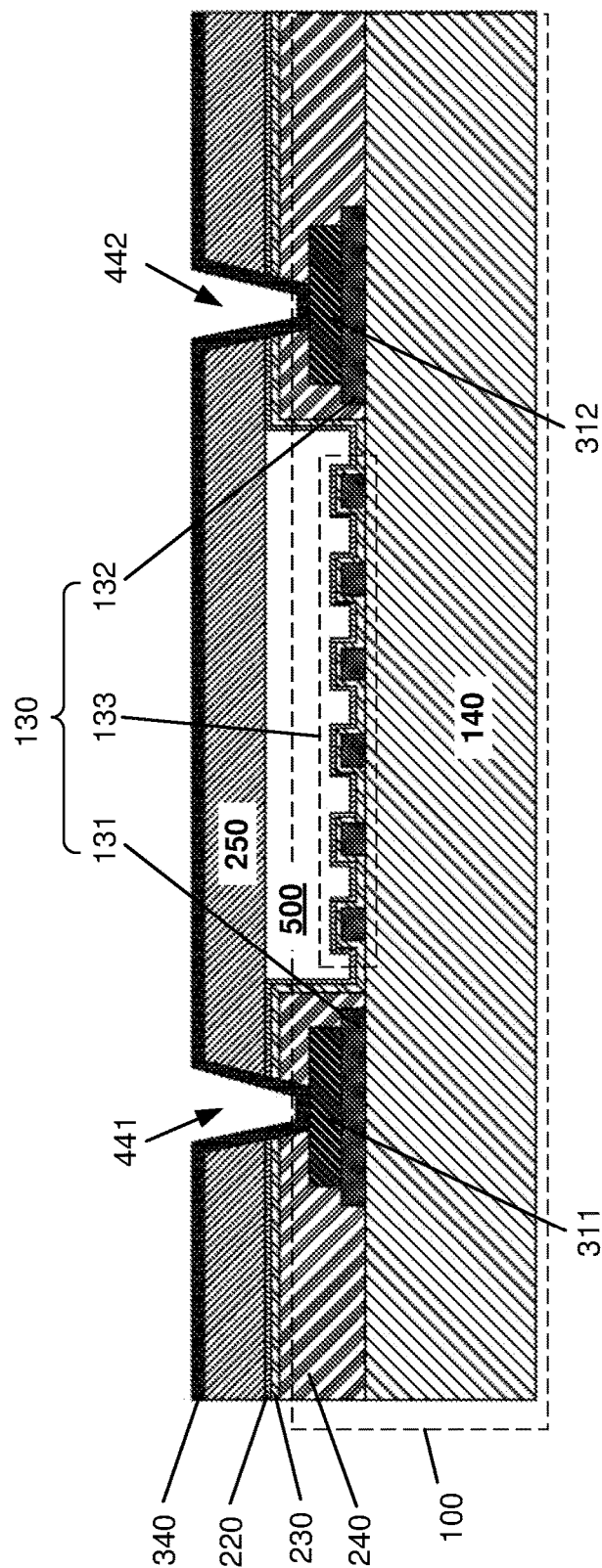

As illustrated in FIG. 3J, in step S9, a seed layer 340 is deposited on the structure of FIG. 3I. Seed layer 340 covers the bottoms and sidewalls of first TSV 441 and second TSV 442, and the top surface of second substrate 250. Seed layer 340 may be formed of a stacked combination of Ti and Cu, or a stacked combination of Cr and Cu.

Figure 3K:
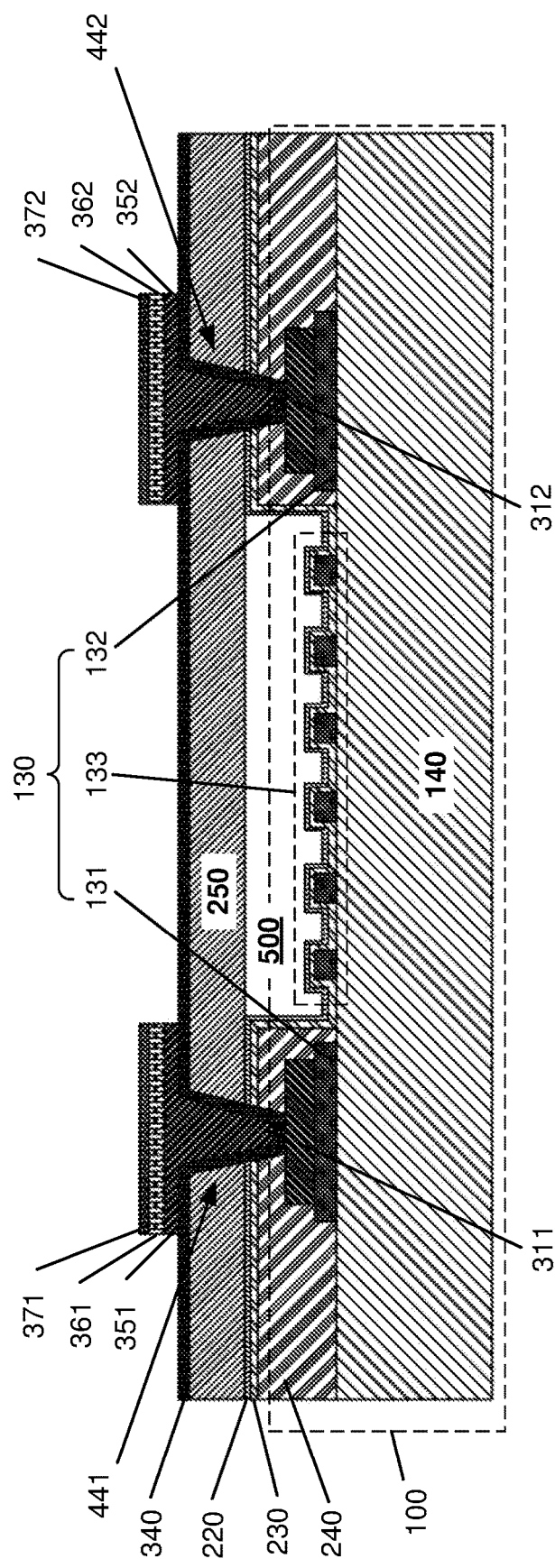

As illustrated in FIG. 3K, in step S10, first and second metal filling layers 351 and 352 are formed by electroplating. First and second metal filling layers 351 and 352 fill in first and second TSVs 441 and 442, respectively, and cover seed layer 340 on the edges of first and second TSVs 441 and 442, respectively. First and second metal filling layers 351 and 352 may be formed of Cu. Next, first and second Ni layers 361 and 362 are formed on first and second metal filling layers 351 and 352, respectively, by electroplating or electroless plating. First and second Ni layers 361 and 362 may have a thickness of approximately 3 µm. Then, first and second Au layers 371 and 372 are formed on first and second Ni layers 361 and 362, respectively, by electroplating or electroless plating. First and second Au layers 371 and 372 may have a thickness ranging from 0.05 µm to 0.30 µm.

Figure 3L:
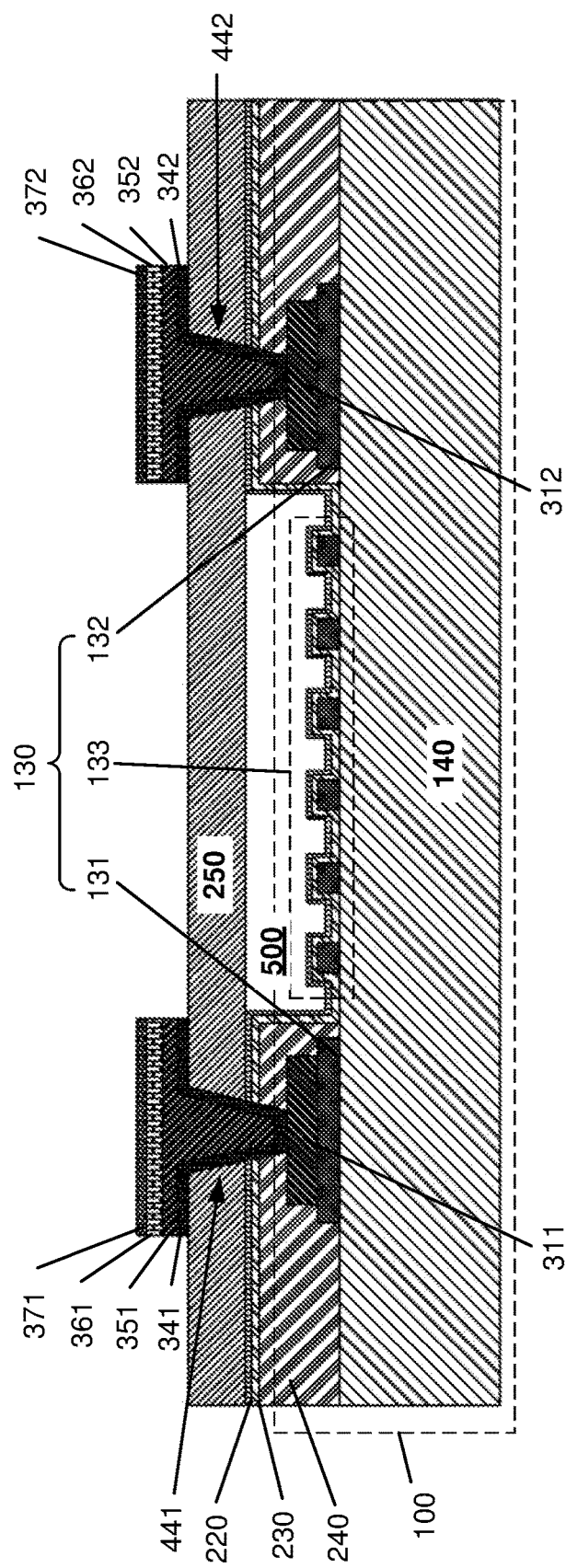

As illustrated in FIG. 3L, in step S11, exposed portions of seed layer 340, which is not covered by first and second Ni layers 361 and 362 and first and second Au layers 371 and 372, are removed. As a result, first seed layer 341 and second seed layer 342 are formed. First seed layer 341 covers side surfaces and the bottom of first TSV 441 and the first portion of the top surface of second substrate 250 around first TSV 441. Second seed layer 342 covers side surfaces and the bottom of second TSV 442 and the second portion of the top surface of second substrate 250 around second TSV 442.

Figure 3M:
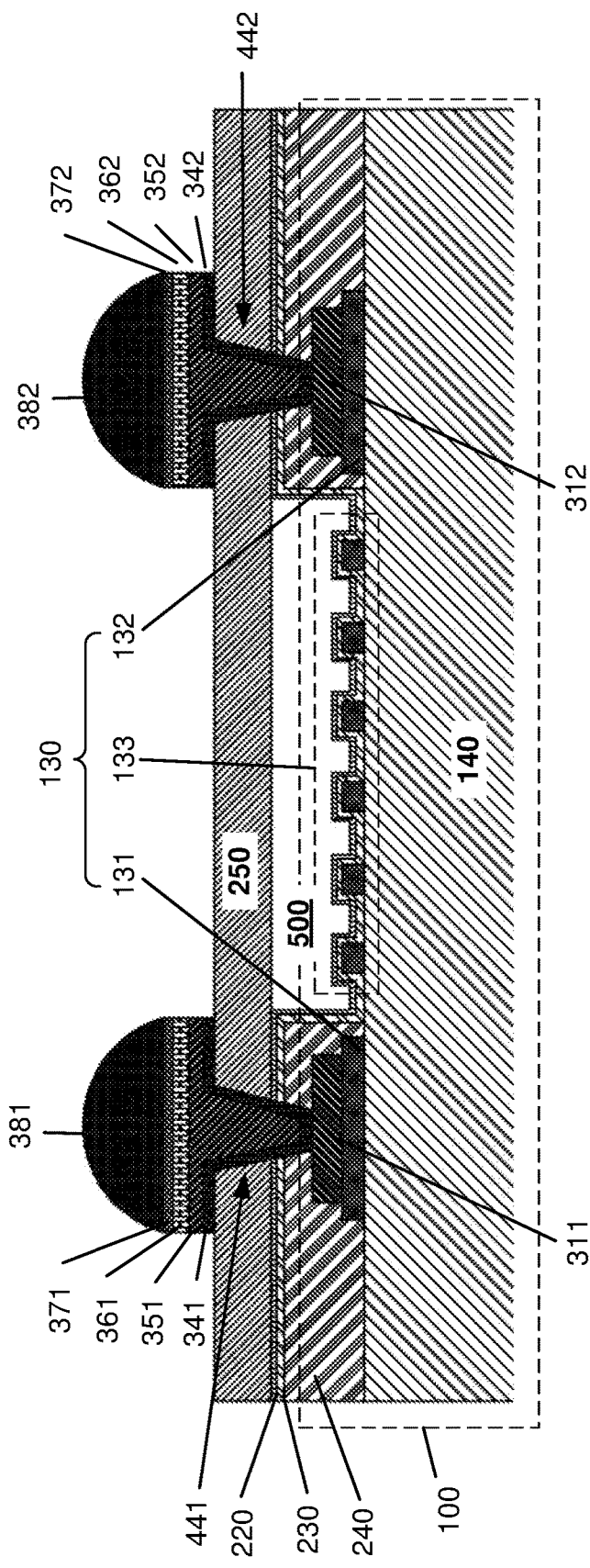

As illustrated in FIG. 3M, in step S12, a solder paste is printed on first and second Au layers 371 and 372, and a thermal reflow process is performed on the printed solder paste to form first solder bump 381 on first Au layer 371 and second solder bump 382 on second Au layer 372. Thus, SAW filter 1000 illustrated in FIG. 1A is fabricated.

Figure 4A:
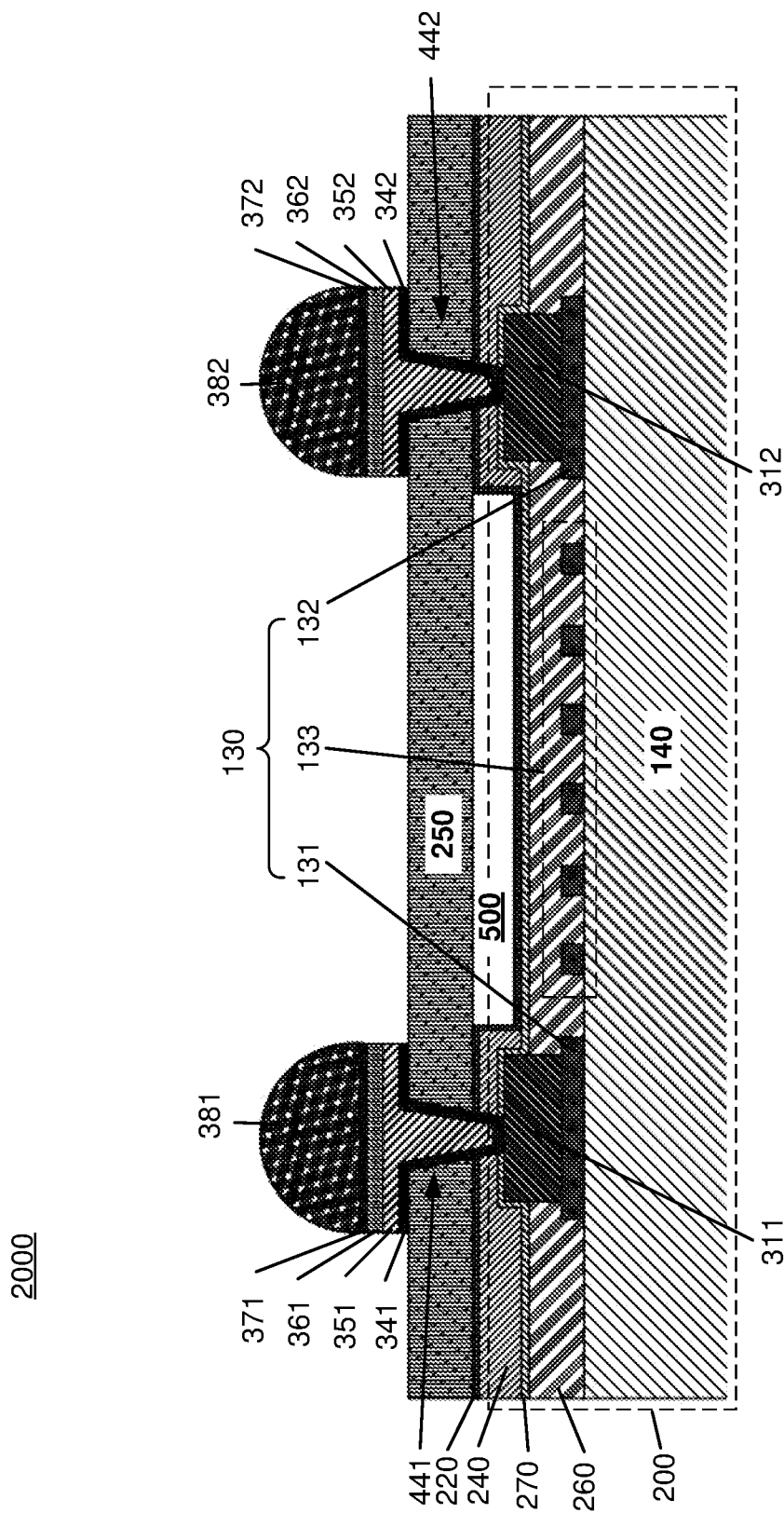
FIG. 4A is a cross-sectional view of a SAW filter, according to an embodiment of the present disclosure.
Figure 4B:
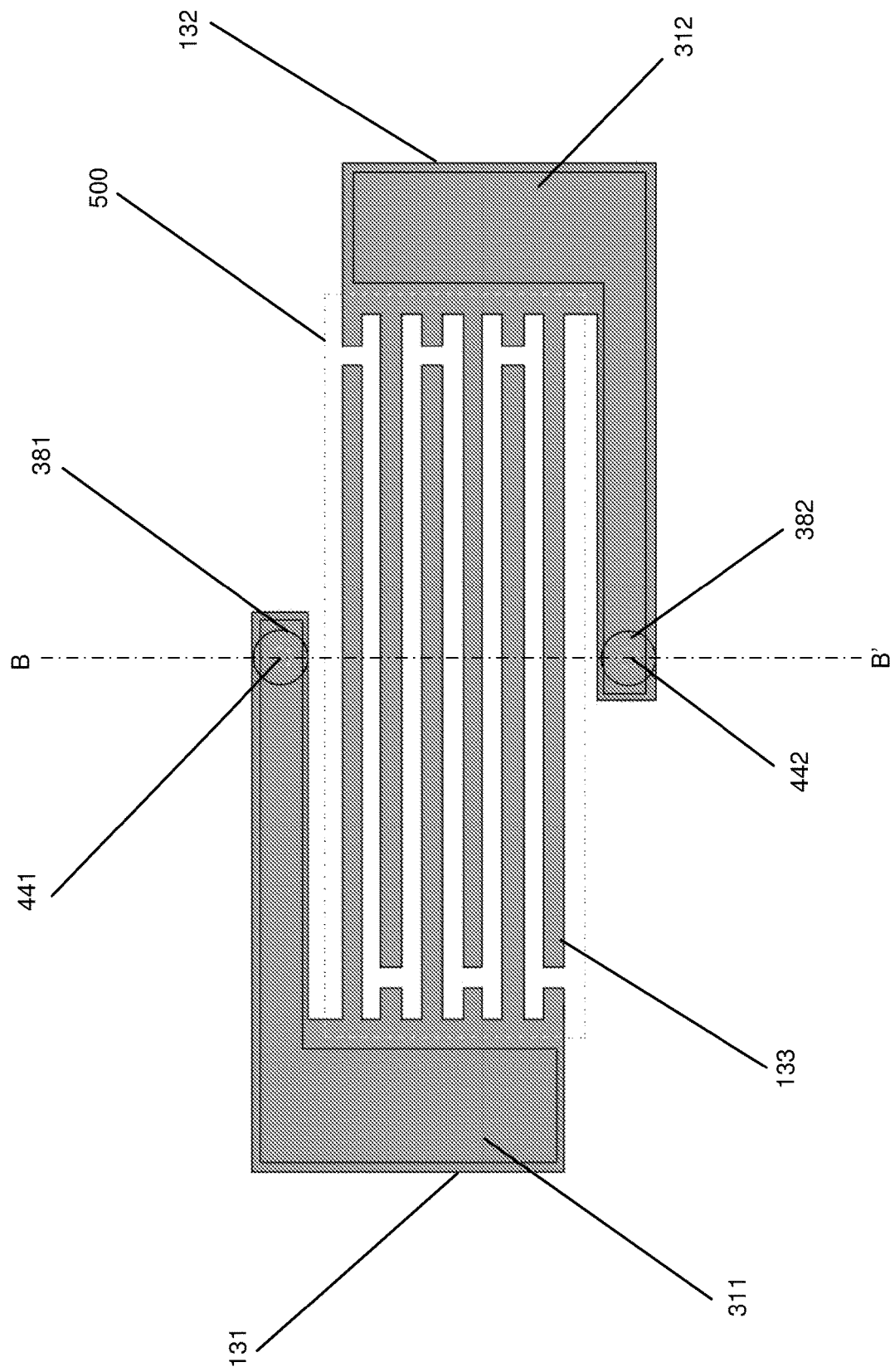
FIG. 4B is a top view showing selected portions of the SAW filter of FIG. 5A, according to an embodiment of the present disclosure.

FIG. 4A is a cross-sectional view of a SAW filter 2000, according to an embodiment of the present disclosure. FIG. 4B is a top view showing selected portions of SAW filter 2000, according to an embodiment of the present disclosure. FIG. 4A shows the cross section along line B-B' in FIG. 4B. SAW filter 2000 in FIGS. 4A and 4B may to referred to as a "temperature compensated (TC) SAW".

As illustrated in FIGS. 4A and 4B, SAW filter 2000 includes a filter wafer 200 which includes a first substrate 140, an interdigital transducer (IDT) 130 disposed on first substrate 140 and including a first input and output end 131, a second input and output end 132, and an interdigital portion 133, a first pad metal layer 311 disposed above first input and output end 131 of IDT 130, a second pad metal layer 312 disposed above second input and output end 132 of IDT 130, a temperature compensation layer 260 disposed on first substrate 140 and covering IDT 130, and a passivation layer 270 disposed on temperature compensation layer 260. Besides filter wafer 200, SAW filter 2000 also includes a dielectric layer 240 disposed on filter wafer 200, and exposing a portion of passivation layer 270 above interdigital portion 133 of IDT 130, a bonding layer 220 disposed on dielectric layer 240, a second substrate 250 bonded to filter wafer 200 via bonding layer 220, and a cavity 500 enclosed by second substrate 250 and bonding layer 220.

Temperature compensation layer 260 covers IDT 130 and sidewalls of lower portions of first pad metal layer 311 and second pad metal layer 312, and exposes to top surfaces and sidewalls of upper portions of first pad metal layer 311 and second pad metal layer 312. Temperature compensation layer 260 may be formed of silicon oxide.

Passivation layer 270 covers temperature compensation layer 260 and the exposed top surfaces and sidewalls of the upper portions of first pad metal layer 311 and second pad metal layer 312. Passivation layer 270 may be formed of silicon nitride, aluminum nitride, amorphous silicon, or a stacked combination of two or more of those materials.

In some embodiments, dielectric layer 240 covers all of passivation layer 270 except for the portion of passivation layer 270 above interdigital portion 133 of IDT 130. In some other embodiments, dielectric layer 240 covers part of passivation layer 270 except for the portion of passivation layer 270 above interdigital portion 133 of IDT 130. Dielectric layer 240 may be formed of silicon oxide, silicon nitride, or a stacked combination of those materials.

Bonding layer 220 is disposed on a top surface and side surfaces of dielectric layer 240. Bonding layer 220 may be a thin silicon layer formed of silicon, and may have a thickness ranging from approximately 3 nm to approximately 50 nm.

First substrate 140 may be formed of a piezoelectric material, such as lithium tantalate or lithium niobate.

At least a surface layer of second substrate 250 facing filter wafer 200 may be formed of silicon. In some embodiments, the entire second substrate 250 may be a silicon wafer.

A first through silicon via (TSV) 441 and a second TSV 442 are formed in second substrate 250, bonding layer 220, dielectric layer 240, and passivation layer 270, and. First TSV 441 exposes first pad metal layer 311, and second TSV 442 exposes second pad metal layer 312.

A first seed layer 341 covers side surfaces and a bottom of first TSV 441 and a first portion of a top surface of second substrate 250 around first TSV 441. A second seed layer 342 covers side surfaces and a bottom of second TSV 442 and a second portion of the top surface of second substrate 250 around second TSV 442. First seed layer 341 and second seed layer 342 may be formed of a stack of Ti and Cu, or a stack of Cr and Cu.

A first metal filling layer 351 is disposed on first seed layer 341 and filled in first TSV 441. A second metal filling layer 352 is disposed on second seed layer 342 and filled in second TSV 442. First metal filling layer 351 and second metal filling layer 352 may be formed of Cu.

A first Ni layer 361 is disposed on first metal filling layer 351. A second Ni layer 362 is disposed on second metal filling layer 352. First Ni layer 361 and second Ni layer 362 may have a thickness of approximately 3 µm.

A first Au layer 371 is disposed on first Ni layer 361. A second Au layer 372 is disposed on second Ni layer 362. First Au layer 371 and second Au layer 372 may have a thickness ranging from approximately 0.05 µm to approximately 0.30 µm.

A first solder bump 381 is disposed above first TSV 441 and electrically connected to first input and output end 131 of IDT 130 via first pad metal layer 311, first metal filling layer 351, first Ni layer 361, and first Au layer 371. A second solder bump 382 is disposed above second TSV 442 and electrically connected to second input and output end 132 of IDT 130 via second pad metal layer 312, second metal filling layer 352, second Ni layer 362, and second Au layer 372.

Figure 5:
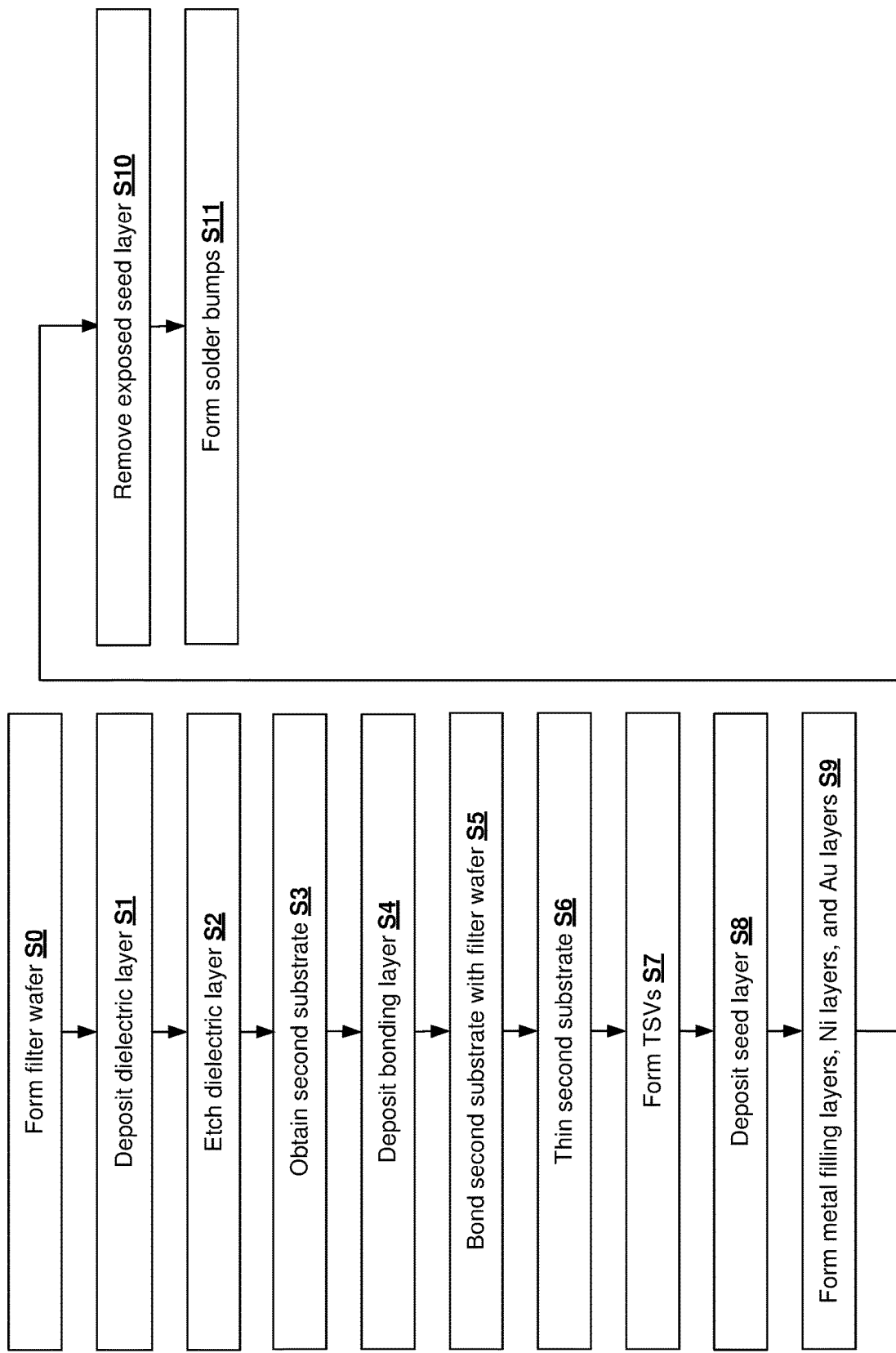
FIG. 5 is a flow chart of a process of fabricating the SAW filter of FIG. 5A, according to an embodiment of the present disclosure.

FIG. 5 is a flow chart of a process of fabricating SAW filter 2000, according to an embodiment of the present disclosure. FIGS. 6A-6L are cross-sectional views of structures formed in the process of FIG. 5, according to an embodiment of the present disclosure.

Figure 6A:
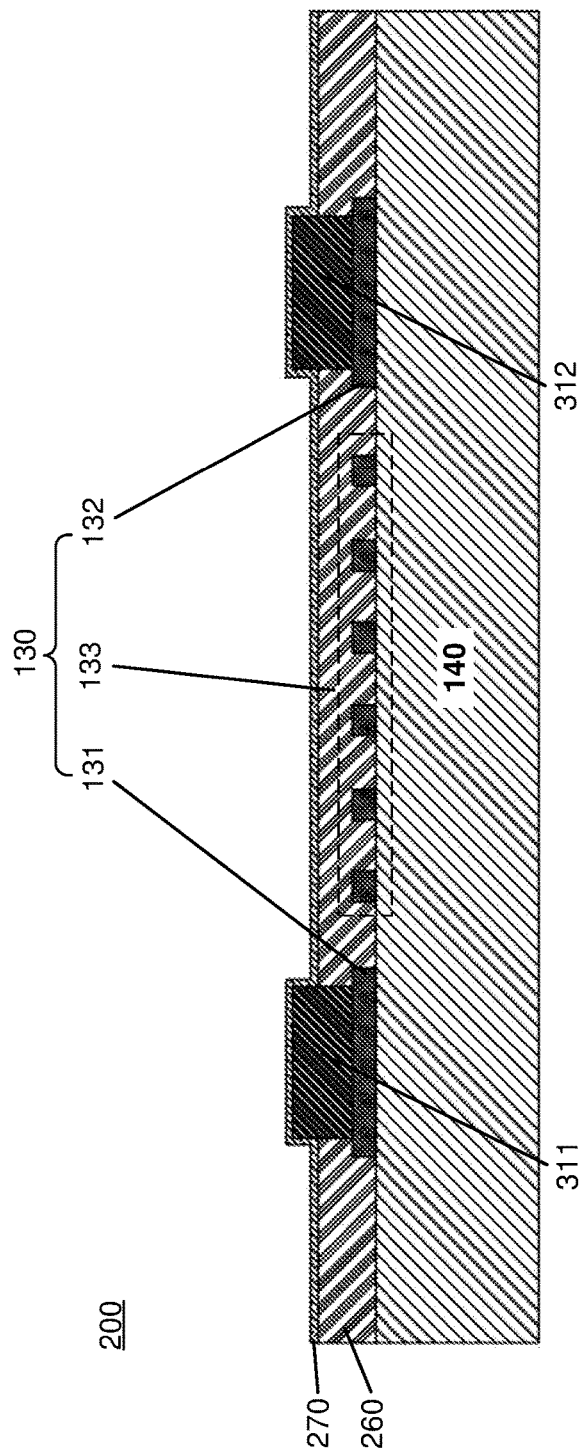
FIGS. 6A-6L are cross-sectional views of structures formed in the process of FIG. 5, according to an embodiment of the present disclosure.

As illustrated in FIG. 6A, in step S0, filter wafer 200 is formed. Specifically, first substrate 140 is obtained. First substrate 140 may be formed of a piezoelectric material, such as lithium tantalate or lithium niobate. IDT 130 is then formed on first substrate 140. IDT 130 includes first input and output end 131, second input and output end 132, and interdigital portion 133. Next, first pad metal layer 311 is formed above first input and output end 131 of IDT 130, and second pad metal layer 312 is formed above second input and output end 132 of IDT 130. Temperature compensation layer 260 is formed on IDT 130, covering IDT 130 and sidewalls of lower portions of first pad metal layer 311 and second pad metal layer 312, and exposes top surfaces and sidewalls of upper portions of first pad metal layer 311 and second pad metal layer 312. Temperature compensation layer 260 may be formed of silicon oxide. Passivation layer 270 is formed on temperature compensation layer 260, covering temperature compensation layer 260 and the exposed top surfaces and sidewalls of the upper portions of first pad metal layer 311 and second pad metal layer 312. Passivation layer 270 may be formed of silicon nitride, aluminum nitride, amorphous silicon, or a stacked combination of two or more of those materials. Thus, filter wafer 200 is formed.

Figure 6B:
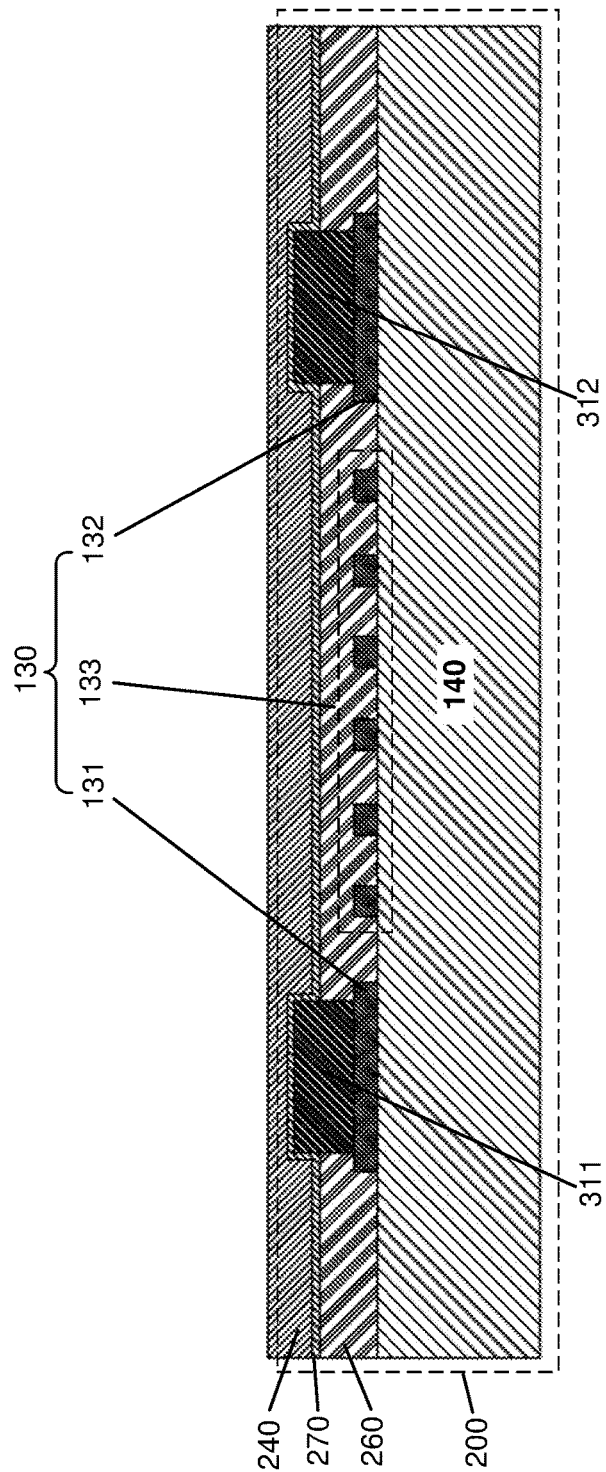

As illustrated in FIG. 6B, in step S1, dielectric layer 240 is deposited on filter wafer 100, and is planarized by chemical mechanical polishing (CMP). The planarized dielectric layer 240 completely covers passivation layer 270, including top surfaces and side surfaces of passivation layer 270. Dielectric layer 240 may be formed of silicon oxide, silicon nitride, or other dielectric materials, or a stacked combination of two or more of those materials.

Figure 6C:
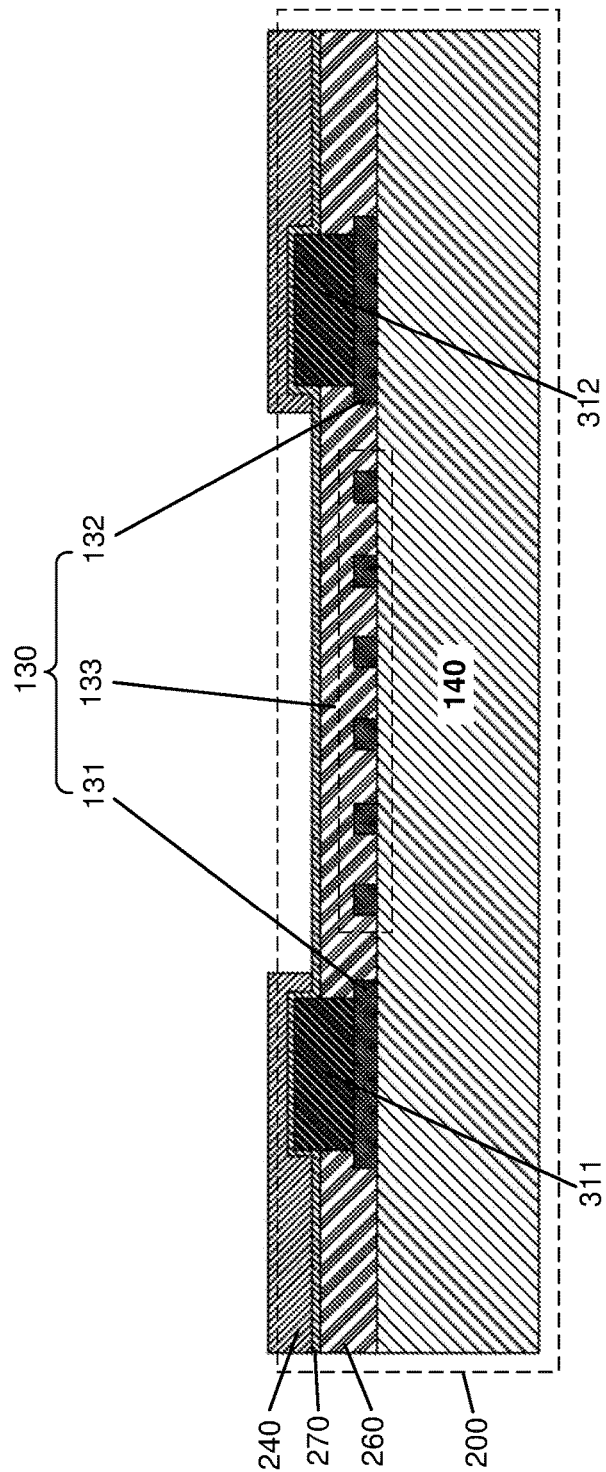

As illustrated in FIG. 6C, in step S2, dielectric layer 240 is etched to expose a portion of passivation layer 270 disposed above interdigital portion 133 of IDT 130.

Figure 6D:
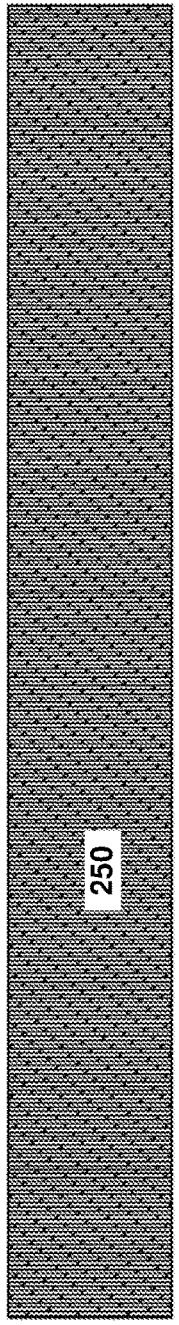
Figure 6D:
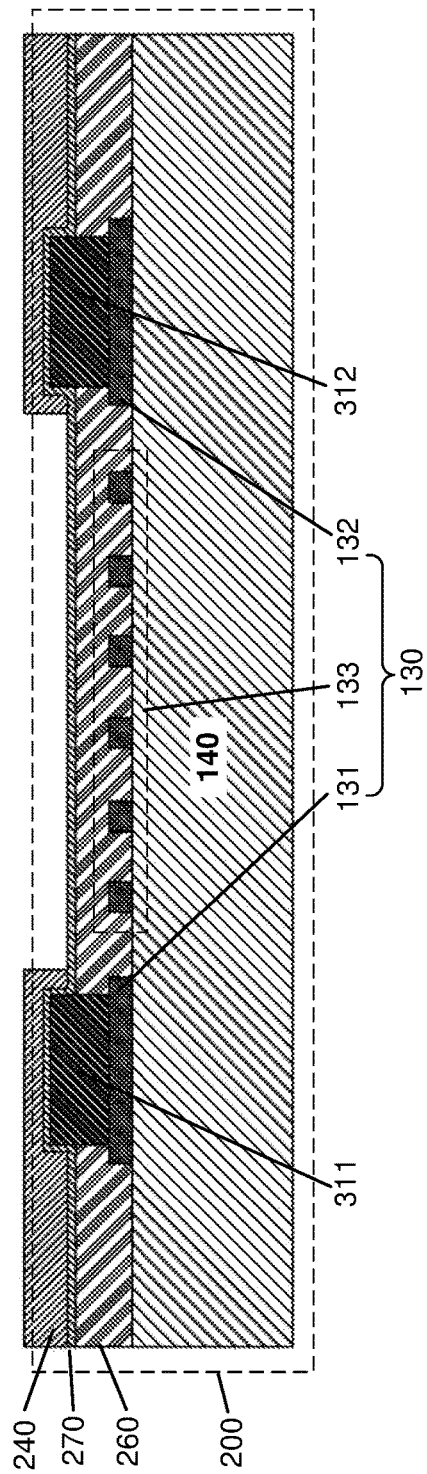

As illustrated in FIG. 6D, in step S3, second substrate 250 is obtained. In some embodiments, second substrate 250 may be high-resistance silicon wafer. In some other embodiments, at least a surface layer of second substrate 250 facing filter wafer 100 is formed of a high-resistance silicon material.

Figure 6E:
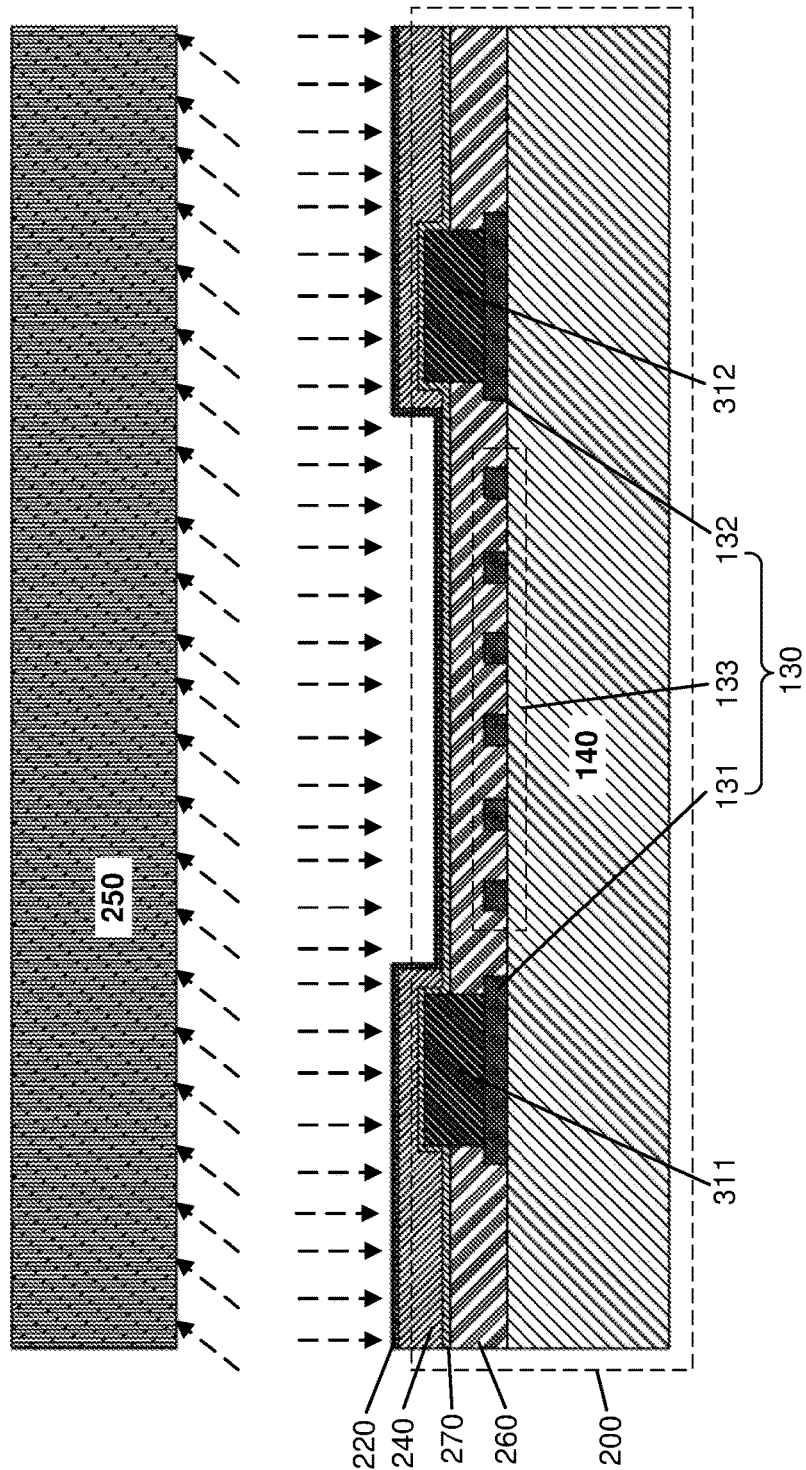

As illustrated in FIG. 6E, in step S4, a sputter target is sputtered in a vacuum environment to deposit bonding layer 220 on dielectric layer 240. The sputtering process may include physical vapor deposition (PVD) or electron beam irradiation. In some embodiments, second substrate 250 may be used as the sputtering target. In some other embodiments, another silicon wafer may be used as the sputtering target. Bonding layer 220 may be deposited on a top surface and side surfaces of dielectric layer 240. Bonding layer 220 may be formed of amorphous silicon (amorphous-Si), and may have a thickness ranging from approximately 3 nm to approximately 50 nm.

Figure 6F:
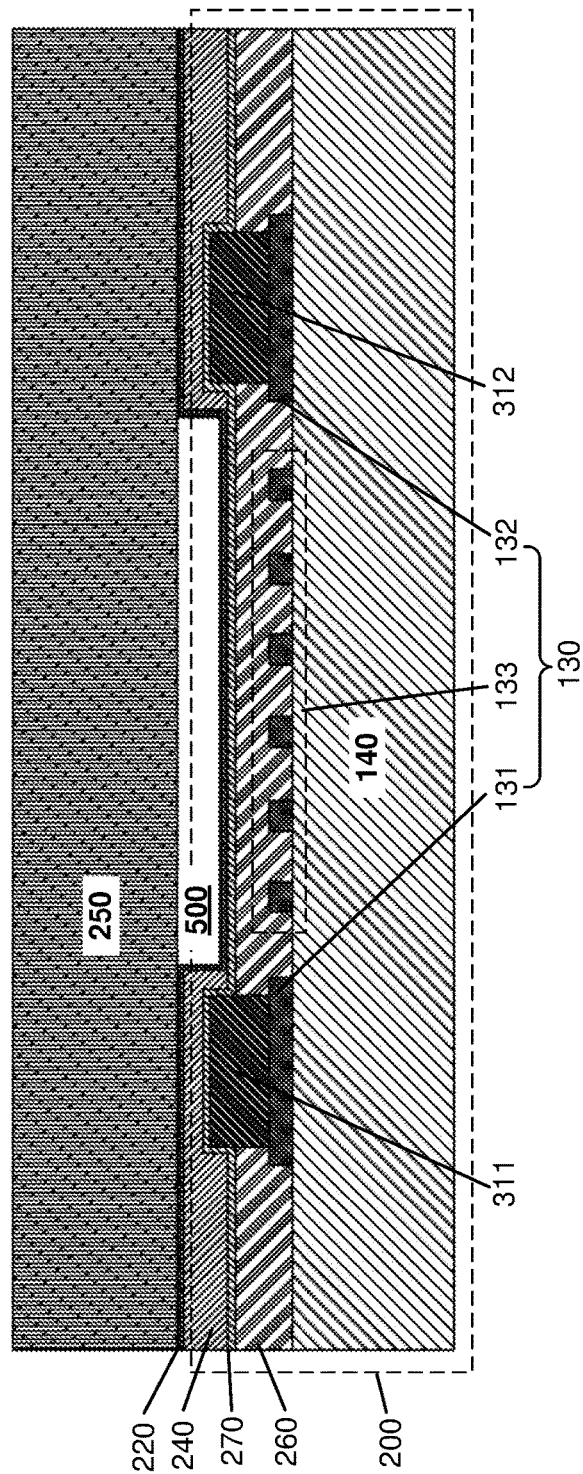

As illustrated in FIG. 6F, in step S5, after depositing bonding layer 220 and without exposing bonding layer 220 to air, second substrate 250 is bonded to filter wafer 100 via bonding layer 220 in the vacuum environment. In the present embodiment, the bonding process is a low-temperature process without thermal annealing. The low-temperature bonding process of the present embodiments can avoid cracking of first substrate 140 during a thermal annealing process due to a large difference between the thermal expansion coefficients of first substrate 140 (formed of lithium tantalate or lithium niobate) and second substrate 250 (formed of silicon). As a result of the bonding process, cavity 500 is formed.

Figure 6G:
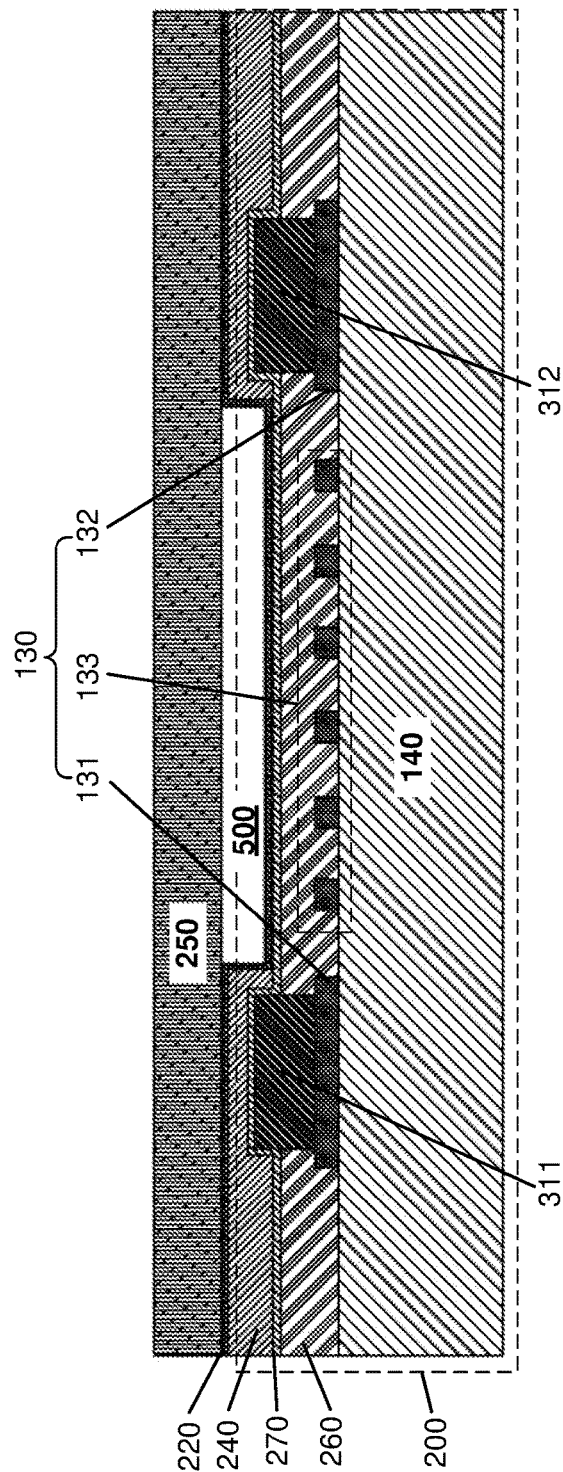

As illustrated in FIG. 6G, in step S6, second substrate 250 is thinned to a desired thickness. In some embodiments, step S6 may be skipped.

Figure 6H:
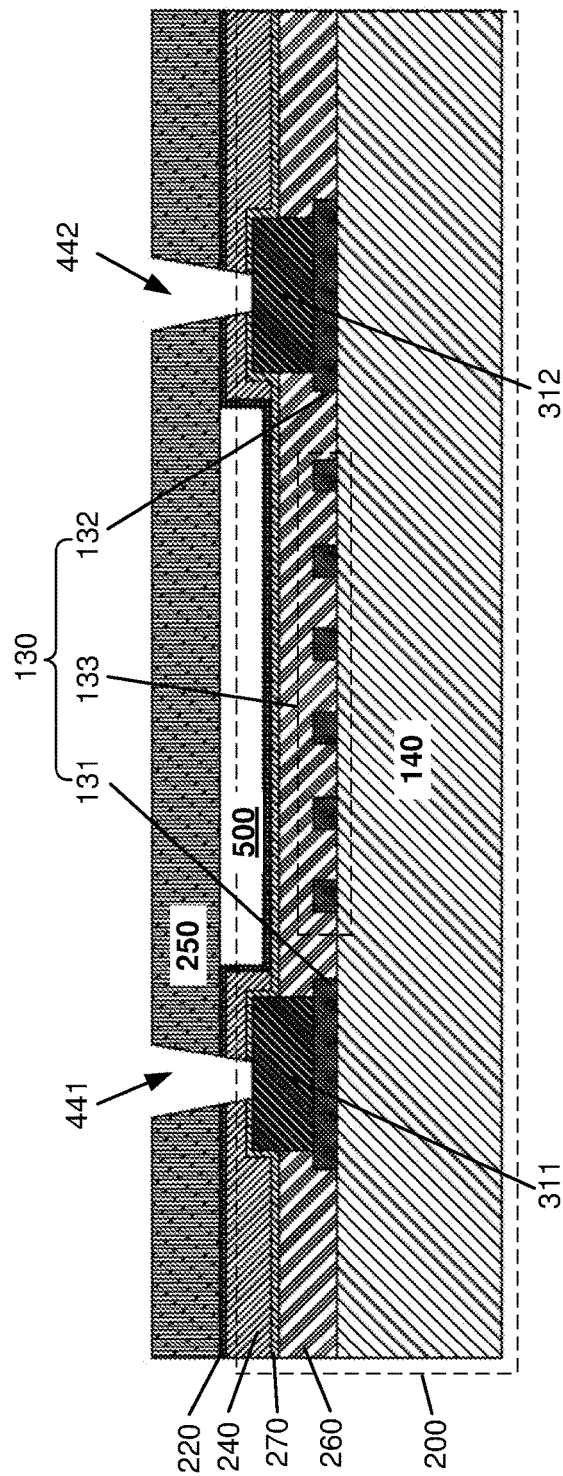

As illustrated in FIG. 6H, in step S7, first TSV 441 and second TSV 442 are formed by etching second substrate 250, bonding layer 220, dielectric layer 240, and passivation layer 230. First TSV 441 exposes first pad metal layer 311, and second TSV 442 exposes second pad metal layer 312.

Figure 6I:
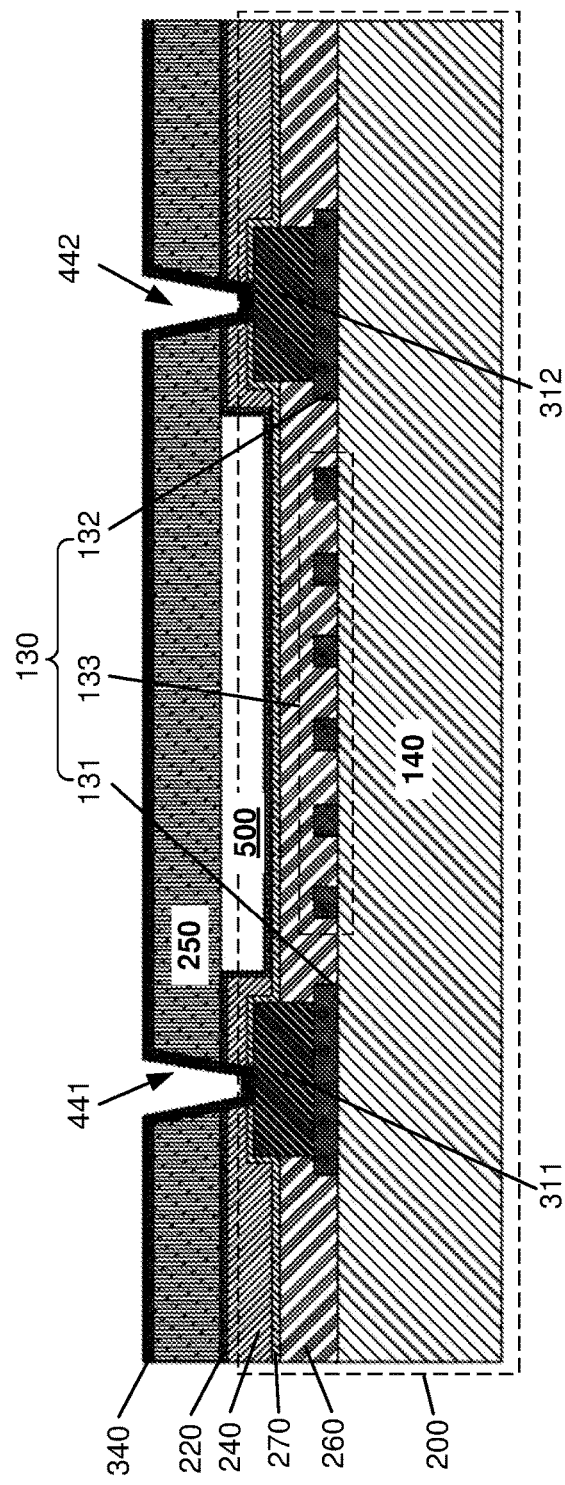

As illustrated in FIG. 6I, in step S8, a seed layer 340 is deposited on the structure of FIG. 6H. Seed layer 340 covers the bottoms and sidewalls of first TSV 441 and second TSV 442, and the top surface of second substrate 250. Seed layer 340 may be formed of a stacked combination of Ti and Cu, or a stacked combination of Cr and Cu.

Figure 6J:
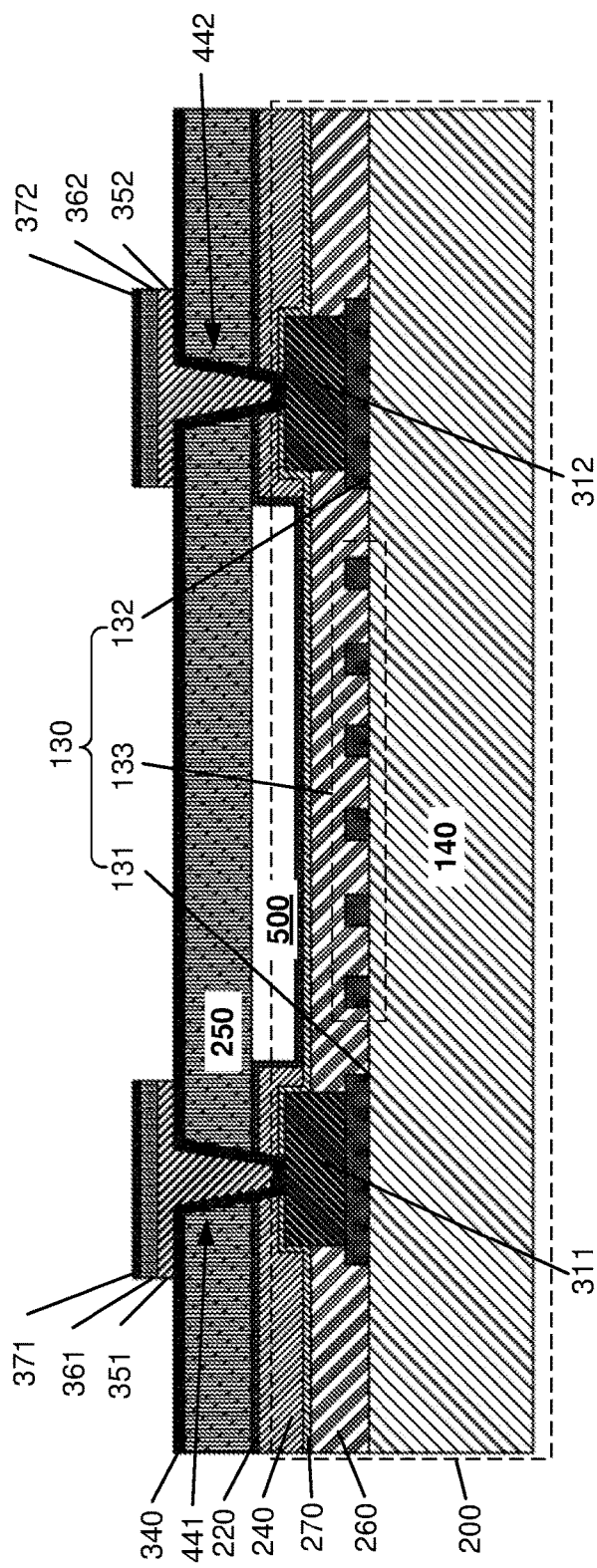

As illustrated in FIG. 6J, in step S9, first and second metal filling layers 351 and 352 are formed by electroplating. First and second metal filling layers 351 and 352 fill in first and second TSVs 441 and 442, respectively, and cover seed layer 340 on the edges of first and second TSVs 441 and 442, respectively. First and second metal filling layers 351 and 352 may be formed of Cu. Next, first and second Ni layers 361 and 362 are formed on first and second metal filling layers 351 and 352, respectively, by electroplating or electroless plating. First and second Ni layers 361 and 362 may have a thickness of approximately 3 μm. Then, first and second Au layers 371 and 372 are formed on first and second Ni layers 361 and 362, respectively, by electroplating or electroless plating. First and second Au layers 371 and 372 may have a thickness ranging from 0.05 μm to 0.30 μm.

Figure 6K:
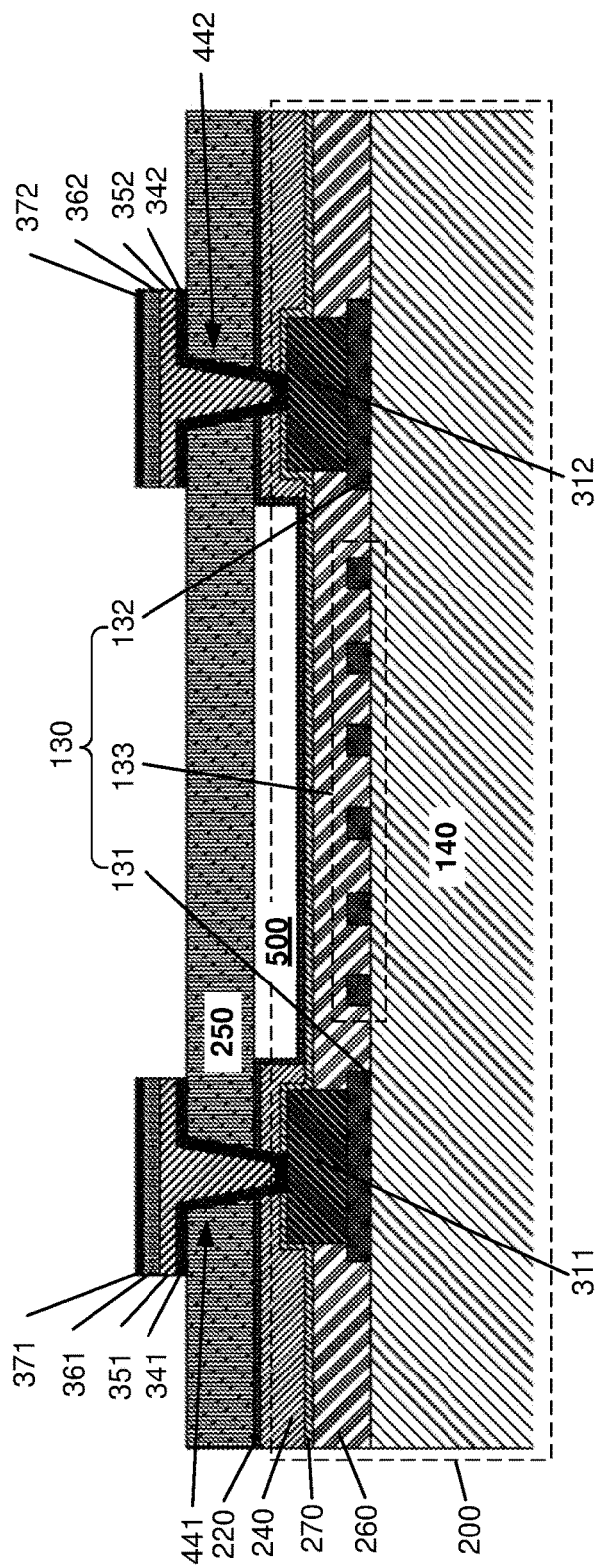

As illustrated in FIG. 6K, in step S10, exposed portions of seed layer 340, which is not covered by first and second Ni layers 361 and 362 and first and second Au layers 371 and 372, are removed. As a result, first seed layer 341 and second seed layer 342 are formed. First seed layer 341 covers side surfaces and the bottom of first TSV 441 and the first portion of the top surface of second substrate 250 around first TSV 441. Second seed layer 342 covers side surfaces and the bottom of second TSV 442 and the second portion of the top surface of second substrate 250 around second TSV 442.

Figure 6L:
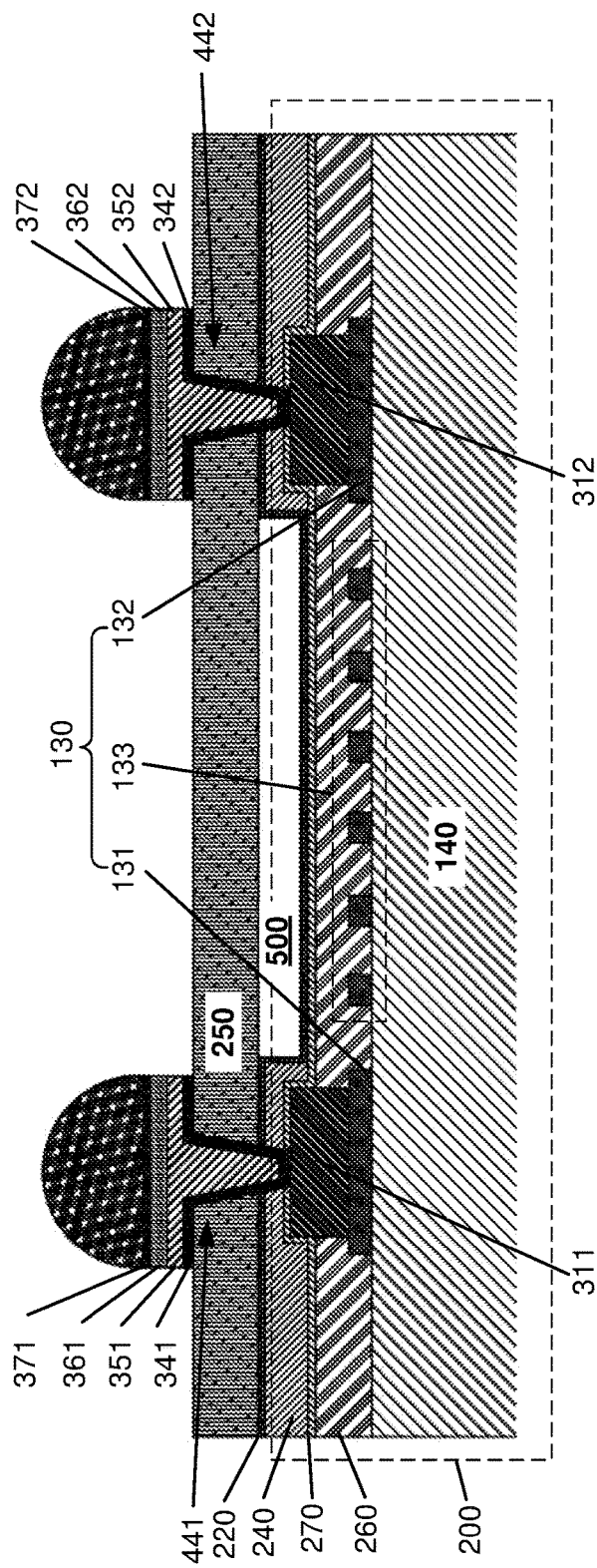

As illustrated in FIG. 6L, in step S11, a solder paste is printed on first and second Au layers 371 and 372, and a thermal reflow process is performed on the printed solder paste to form first solder bump 381 on first Au layer 371 and second solder bump 382 on second Au layer 372. Thus, SAW filter 1000 illustrated in FIG. 1A is fabricated.

Other embodiments of the disclosure will be apparent to those skilled in the art from consideration of the specification and practice of the disclosure disclosed herein. It is intended that the specification and examples be considered as exemplary only, with a true scope and spirit of the invention being indicated by the following claims.

What is claimed is:

1. A fabrication method of a surface acoustic wave (SAW) filter, comprising:
   obtaining a filter wafer, comprising:
      obtaining a first substrate; and
      forming an interdigital transducer (IDT) on the first substrate, the IDT including a first input and output end, a second input and output end, and an interdigital portion;
   forming a dielectric layer on the filter wafer, the dielectric layer covering the first input and output end and the second input and output end of the IDT, and exposing the interdigital portion;
   forming a passivation layer on the dielectric layer;
   forming a bonding layer on the passivation layer; and
   bonding a second substrate to the filter wafer via the bonding layer,
   wherein a cavity is enclosed by the second substrate and the bonding layer, and the forming the bonding layer on the passivation layer comprises:
      sputtering, in a vacuum environment, the second substrate to deposit the bonding layer on a top surface and side surfaces of the passivation layer.

2. The fabrication method of claim 1, wherein the bonding the second substrate to the filter wafer is performed in the vacuum environment after the bonding layer is deposited on the passivation layer.

3. The fabrication method of claim 1, wherein the dielectric layer is formed of silicon oxide, silicon nitride, or a stacked combination of those materials.

4. The fabrication method of claim 1, wherein the passivation layer is formed on a top surface and side surfaces of the dielectric layer, and is formed of silicon oxide, silicon nitride, aluminum nitride, or a stacked combination of two or more those materials.

5. The fabrication method of claim 1, wherein the bonding layer is formed on the top surface and the side surfaces of the passivation layer, and is formed of silicon, and has a thickness ranging from approximately 3 nm to approximately 50 nm.

6. The fabrication method of claim 1, wherein
   the first substrate is formed of lithium tantalate or lithium niobate.

7. The fabrication method of claim 1, wherein
   a surface layer of the second substrate facing the filter wafer is formed of silicon.

8. The fabrication method of claim 1, further comprising:
forming a first pad metal layer above the first input and output end of the IDT, and a second pad metal layer above the second input and output end of the IDT;
forming a first through silicon via (TSV) and a second TSV in the second substrate, the bonding layer, the passivation layer, and the dielectric layer, the first TSV exposing the first pad metal layer, and the second TSV exposing the second pad metal layer;
forming a first seed layer covering side surfaces and a bottom of the first TSV and a first portion of a top surface of the second substrate around the first TSV, and a second seed layer covering side surfaces and a bottom of the second TSV and a second portion of the top surface of the second substrate around the second TSV;
forming a first metal filling layer on the first seed layer and filled in the first TSV, and a second metal filling layer on the second seed layer and filled in the second TSV;
forming a first Ni layer on the first metal filling layer, and a second Ni layer on the second metal filling layer;
forming a first Au layer on the first Ni layer, and a second Au layer on the second Ni layer; and
forming a first solder bump disposed above the first TSV and electrically connected to the first pad metal layer via the first metal filling layer, the first Ni layer, and the first Au layer, and a second solder bump above the second TSV and electrically connected to the second pad metal layer via the second metal filling layer.

* * * * *

UNITED STATES PATENT AND TRADEMARK OFFICE
CERTIFICATE OF CORRECTION

PATENT NO. : 12,355,414 B2
APPLICATION NO. : 18/056799
DATED : July 8, 2025
INVENTOR(S) : Guojun Weng Page 1 of 1

It is certified that error appears in the above-identified patent and that said Letters Patent is hereby corrected as shown below:

In the Claims

Claim 4, Column 10, Lines 55-56, "two or more those materials" should read --two or more of those materials--.

Signed and Sealed this
Sixteenth Day of September, 2025

Coke Morgan Stewart
*Acting Director of the United States Patent and Trademark Office*